US012635501B2

(12) United States Patent
Chen et al.

(10) Patent No.: US 12,635,501 B2
(45) Date of Patent: May 19, 2026

(54) INTEGRATED CHIP INCLUDING THROUGH-SUBSTRATE VIA (TSV) AND LANDING STRUCTURE

(71) Applicant: Taiwan Semiconductor Manufacturing Company, Ltd., Hsinchu (TW)

(72) Inventors: Chieh-En Chen, Tainan (TW); Chen-Hsien Lin, Tainan (TW); Shyh-Fann Ting, Tainan (TW); Hsing-Chih Lin, Tainan (TW); Dun-Nian Yaung, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 297 days.

(21) Appl. No.: 18/346,554

(22) Filed: Jul. 3, 2023

(65) Prior Publication Data

US 2025/0014987 A1     Jan. 9, 2025

(51) Int. Cl.
H01L 23/48 (2006.01)
H01L 23/00 (2006.01)
(Continued)

(52) U.S. Cl.
CPC ........ H01L 23/5226 (2013.01); H01L 23/481 (2013.01); H01L 23/49816 (2013.01); H01L 23/49822 (2013.01); H01L 23/562 (2013.01); H01L 24/32 (2013.01); H01L 24/48 (2013.01); H01L 25/0657 (2013.01); H01L 2224/32146 (2013.01); H01L 2224/32235 (2013.01); H01L 2224/48157 (2013.01);
(Continued)

(58) Field of Classification Search
CPC .............. H01L 23/5226; H01L 23/481; H01L
23/49816; H01L 23/49822; H01L 23/562; H01L 24/32; H01L 24/48; H01L 25/0657; H01L 2224/32146; H01L 2224/32235; H01L 2224/48157; H01L 2224/48227; H01L 2225/06541; H01L 2924/13091; H01L 21/76898
USPC ........................................ 257/774
See application file for complete search history.

(56) References Cited

U.S. PATENT DOCUMENTS

| | | | | |
|---|---|---|---|---|
| 8,802,504 B1 * | 8/2014 | Hou | ...................... | H01L 21/304 |
| | | | | 438/118 |
| 11,264,486 B2 * | 3/2022 | Chu | ...................... | H10D 30/62 |
| 2020/0381512 A1 | 12/2020 | Kao et al. | | |

FOREIGN PATENT DOCUMENTS

CN          115966521 A      4/2023

* cited by examiner

*Primary Examiner* — Theresa T Doan
(74) *Attorney, Agent, or Firm* — Eschweiler & Potashnik, LLC

(57)          ABSTRACT

An integrated chip including a semiconductor substrate having a first side and a second side, opposite the first side. A first transistor and a second transistor are along the first side of the semiconductor substrate. A dielectric structure including a plurality of dielectric layers is under the first side of the semiconductor substrate. A first metal line is within the dielectric structure. A second metal line is within the dielectric structure and under the first metal line. A first metal via extends between the first metal line and the second metal line. A through-substrate via (TSV) extends from the second side of the semiconductor substrate, through the semiconductor substrate between the first transistor and the second transistor, to the first metal line and the second metal line.

20 Claims, 18 Drawing Sheets

(51)  Int. Cl.
    *H01L 23/498*        (2006.01)
    *H01L 23/52*         (2006.01)
    *H01L 23/522*        (2006.01)
    *H01L 25/065*        (2023.01)

(52)  U.S. Cl.
    CPC .............. *H01L 2224/48227* (2013.01); *H01L 2225/06541* (2013.01); *H01L 2924/13091* (2013.01)

1700

3600

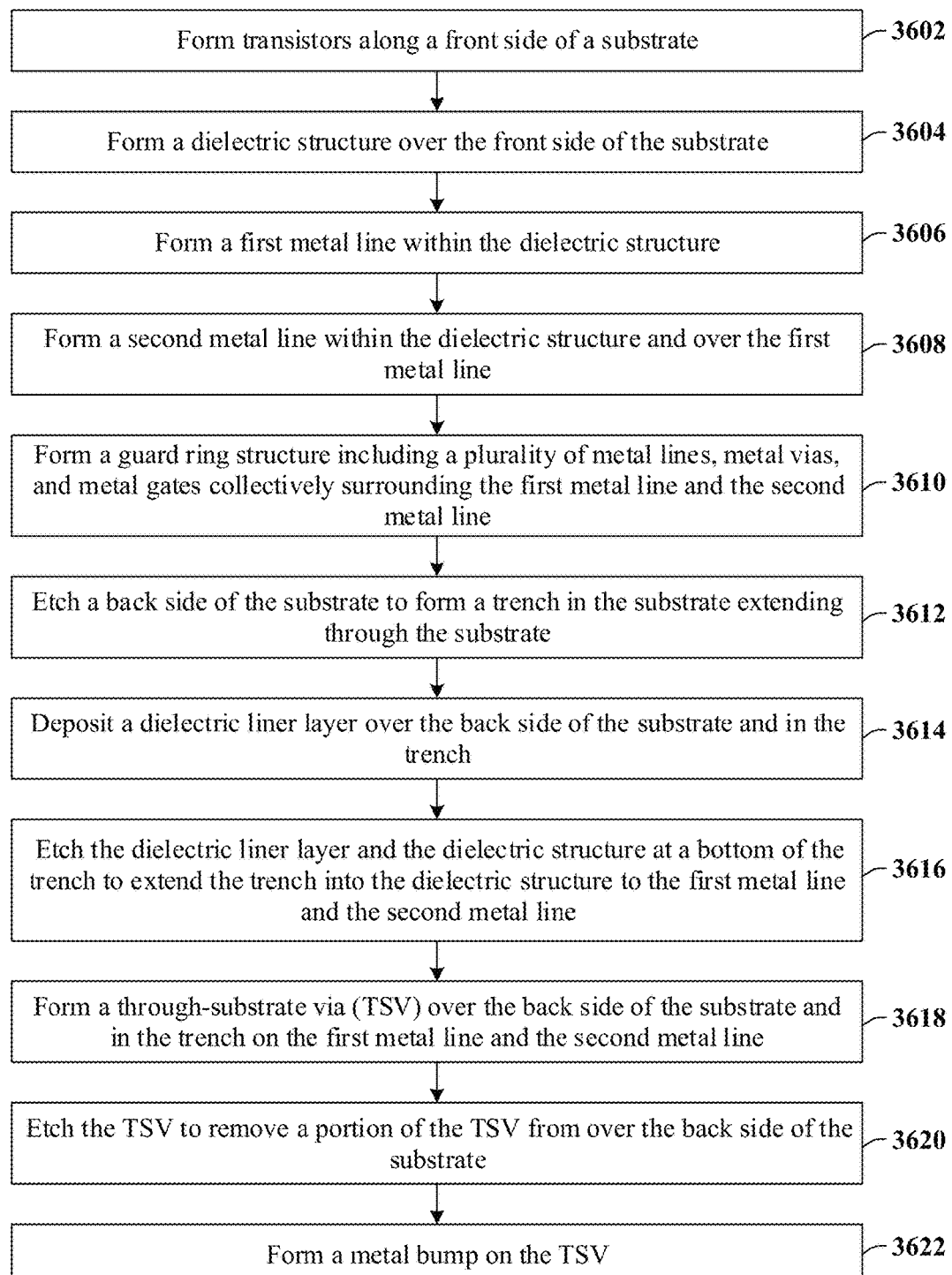

| |
|---|
| Form transistors along a front side of a substrate — 3602 |
| Form a dielectric structure over the front side of the substrate — 3604 |
| Form a first metal line within the dielectric structure — 3606 |
| Form a second metal line within the dielectric structure and over the first metal line — 3608 |
| Form a guard ring structure including a plurality of metal lines, metal vias, and metal gates collectively surrounding the first metal line and the second metal line — 3610 |
| Etch a back side of the substrate to form a trench in the substrate extending through the substrate — 3612 |
| Deposit a dielectric liner layer over the back side of the substrate and in the trench — 3614 |
| Etch the dielectric liner layer and the dielectric structure at a bottom of the trench to extend the trench into the dielectric structure to the first metal line and the second metal line — 3616 |
| Form a through-substrate via (TSV) over the back side of the substrate and in the trench on the first metal line and the second metal line — 3618 |
| Etch the TSV to remove a portion of the TSV from over the back side of the substrate — 3620 |
| Form a metal bump on the TSV — 3622 |

Fig. 36

INTEGRATED CHIP INCLUDING THROUGH-SUBSTRATE VIA (TSV) AND LANDING STRUCTURE

BACKGROUND

Modern day integrated chips contain billions or trillions of semiconductor devices. The semiconductor devices are electrically interconnected by way of back-end-of-the-line metal interconnect layers that are formed above the devices on an integrated chip. A typical integrated chip comprises a plurality of back-end-of-the-line metal interconnect layers embedded within dielectric material. The metal interconnect layers contain corresponding layers of metal wires that are coupled vertically together with metal vias. The size of the metal interconnect layers increases from thin metal lines that connect to the devices, to thick metal lines that connect to off chip components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 36 illustrates a flow diagram of some embodiments of a method for forming an integrated chip including a landing structure and a TSV on the landing structure.

DETAILED DESCRIPTION

Figure 1:
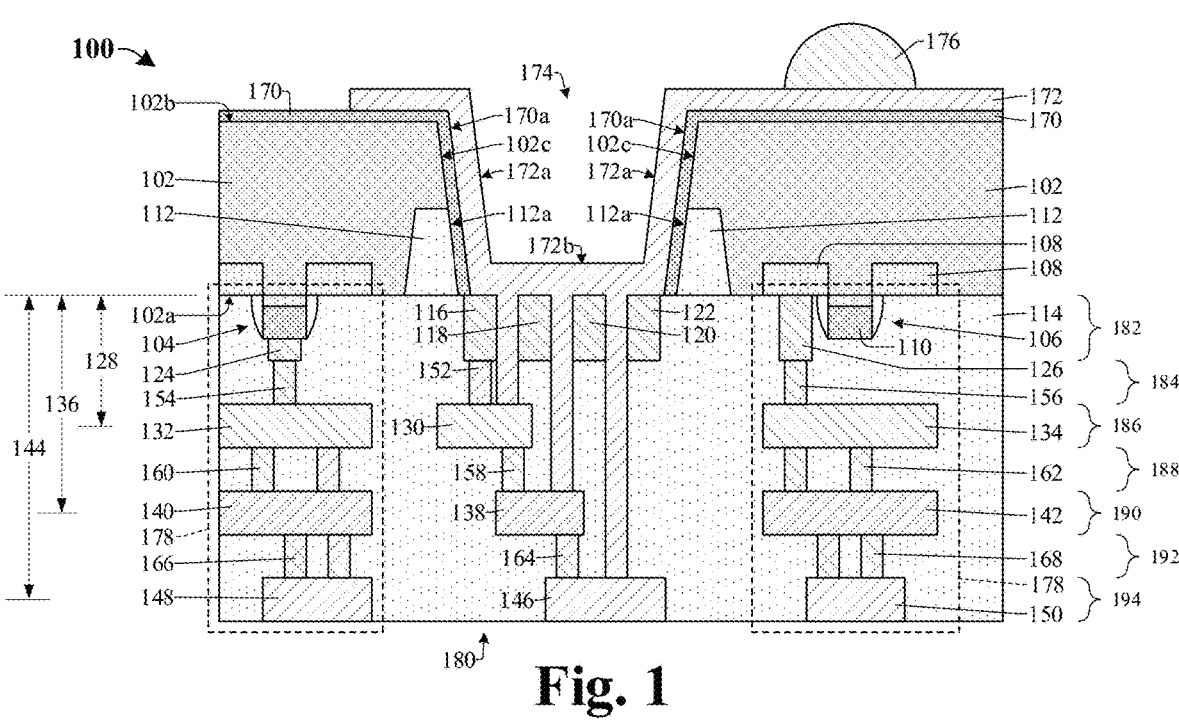
FIG. 1 illustrates a cross-sectional view of some embodiments of an integrated chip comprising a multi-level landing structure and a through-substrate via (TSV) on the landing structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip includes a transistor device arranged along a first side of a semiconductor substrate. A dielectric structure is under the first side of the semiconductor substrate. A metal landing pad is within the dielectric structure. A metal line is below the metal landing pad. A metal via extends from the metal landing pad to the metal line. A through-substrate via (TSV) extends through the semiconductor substrate from a second side of the semiconductor substrate, opposite the first side, to the metal landing pad. The TSV contacts the metal landing pad and is spaced from the second metal line.

As technology advances, metal interconnects such as metal lines and metal landing pads are becoming thinner. Thus, in some chips, the metal landing pad has a reduced thickness. In such devices, it can be challenging to form the TSV on the metal landing pad without damaging and/or deforming the metal landing pad. For example, forming the TSV on the metal landing pad can exert stress on the metal landing pad. When the metal landing pad has a reduced thickness, a likelihood of the metal landing pad suffering damage (e.g., cracking or the like) from the stress may be increased.

In addition, as technology advances, dielectric structures are increasingly formed with dielectrics having reduced dielectric constants, such as extra low-k (ELK) dielectrics. Thus, in some chips, the dielectric structure surrounding the metal landing pad and the TSV includes ELK dielectrics. These ELK dielectrics may be more fragile and may absorb moisture more easily than other dielectrics. Thus, when the dielectric structure includes ELK dielectric, a reliability of the dielectric structure around the landing pad and the TSV may be a concern.

In various embodiments of the present disclosure, the integrated chip includes a multi-level, mesh-like landing structure for the TSV. The integrated chip includes a first metal line and a second metal line within the dielectric structure. The second metal line is under the first metal line. The first metal line is elongated in a first direction and the second metal line is elongated in a second direction (e.g., perpendicular to the first direction) in a mesh-like arrangement. The first metal line and the second metal line form the multi-level, mesh-like landing structure. The TSV extends through the semiconductor substrate from the second side to both the first metal line and the second metal line.

Because the landing structure includes multiple landing levels (e.g., the first metal line, and the second metal line under the first metal line) arranged in a mesh-like fashion (e.g., the first metal line elongated in the first direction and the second metal line elongated in the second direction), stress exerted on the landing structure by the TSV can be spread across multiple layers. Thus, the stress on each individual layer can be reduced. As a result, a likelihood of the landing structure suffering damage due to the forming of the TSV can be reduced.

In some embodiments, the integrated chip further includes a metal guard ring structure surrounding the TSV and the landing structure to mitigate concerns about the reliability of the dielectric(s) surrounding the TSV and the landing structure. For example, a plurality of intercoupled metal lines, metal vias, and metal gates collectively surround the TSV and the landing structure in a closed path around a perimeter of the landing structure. The guard ring structure can protect the dielectric(s) surrounding the TSV and the landing structure from potentially harmful elements such as, for example, moisture or the like. Thus, a reliability of the dielectric(s) may be improved.

Figure 2:
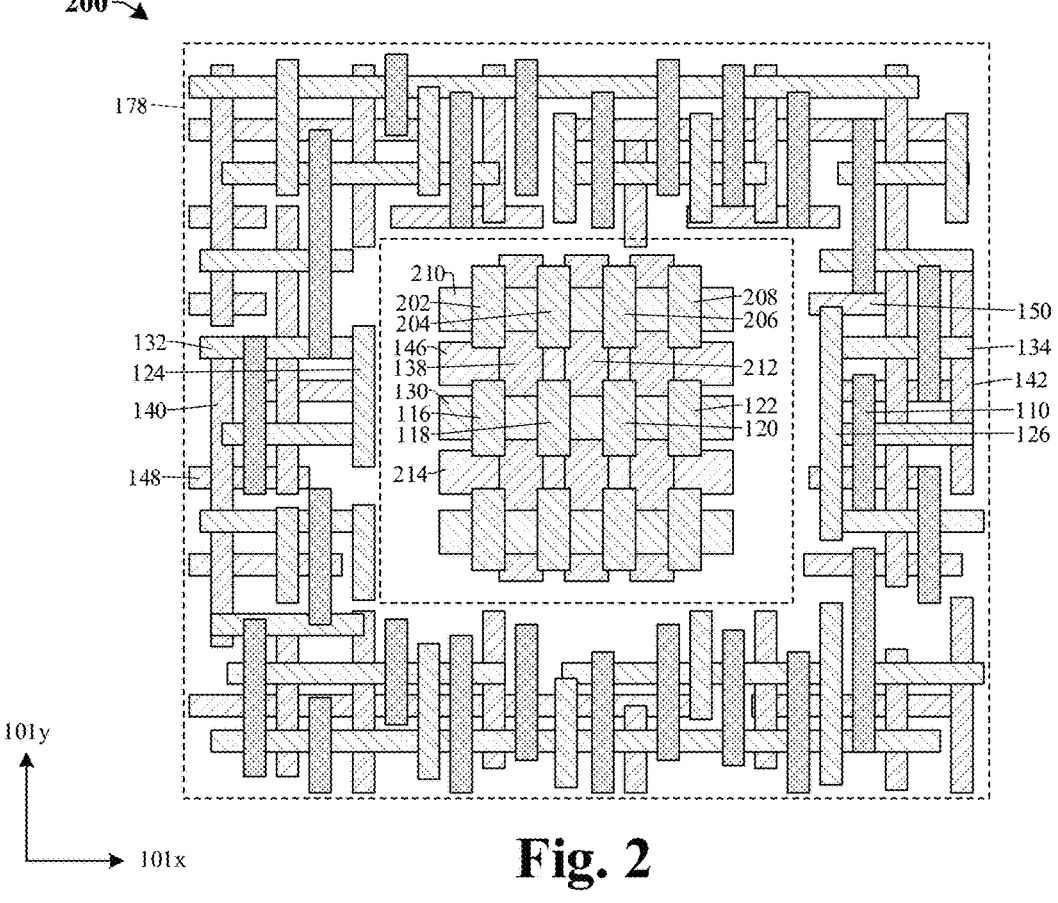
FIG. 2 illustrates a top view of some embodiments of the landing structure of the integrated chip of FIG. 1.

FIG. 1 illustrates a cross-sectional view 100 of some embodiments of an integrated chip including a multi-level landing structure 180 and a TSV 172 on the landing structure 180. FIG. 2 illustrates a top view 200 of some embodiments of the landing structure 180 of the integrated chip of FIG. 1.

The integrated chip includes a semiconductor substrate 102 having a front side 102a and a back side 102b. A first transistor device 104 is arranged along the front side 102a of the substrate 102. A second transistor device 106 is arranged along the front side 102a of the substrate 102 and is laterally spaced from the first transistor device 104. In some embodiments, the transistor devices 104, 106 comprise a pair of source/drains (e.g., source/drains 108) and a gate (e.g., gate 110) extending between the source/drains. Source/drain(s) may refer to a source or a drain, individually or collectively dependent upon the context. In some embodiments, the gates (e.g., gate 110) of the transistor devices 104, 106 comprise metal.

A shallow trench isolation (STI) layer 112 is between the first transistor device 104 and the second transistor device 106. The STI layer 112 extends into the substrate 102 along the front side 102a of the substrate 102. A dielectric structure 114 is under the substrate 102 (e.g., on the front side 102a of the substrate 102). The dielectric structure 114 comprises a plurality of dielectric layers.

A plurality of metal lines are within the dielectric structure 114. For example, a first plurality of metal lines 182 (e.g., metal lines 116, 118, 120, 122, 124, 126, 202, 204, 206, 208) are within the dielectric structure 114 and laterally spaced along the front side 102a of the substrate 102. Some of the first plurality of metal lines 182 contact the transistor devices 104, 106 and some of the first plurality of metal lines 182 are arranged laterally between the transistor devices 104, 106. For example, metal line 124 contacts the first transistor device 104 and metal line 126 contacts the second transistor device 106. Metal lines 116, 118, 120, 122 are directly between the gates of the transistor devices 104, 106.

A second plurality of metal lines 186 (e.g., metal lines 130, 132, 134, 210) are under the first plurality of metal lines 182. The second plurality of metal lines 186 are disposed at a first height 128 from the front side 102a of the substrate 102. A third plurality of metal lines 190 (e.g., metal lines 138, 140, 142, 212) are under the second plurality of metal lines 186. The third plurality of metal lines 190 are disposed at a second height 136 from the front side 102a of the substrate 102, greater than the first height 128. A fourth plurality of metal lines 194 (e.g., metal lines 146, 148, 150, 214) are under the third plurality of metal lines 190. The fourth plurality of metal lines 194 are disposed at a third height 144 from the front side 102a of the substrate 102, greater than the second height 136.

Metal vias extend vertically between the metal lines. For example, a first plurality of metal vias 184 (e.g., metal vias 152, 154, 156) extends from the first plurality of metal lines 182 to the second plurality of metal lines 186. A second plurality of metal vias 188 (e.g., metal vias 158, 160, 162) extend from the second plurality of metal lines 186 to the third plurality of metal lines 190. A third plurality of metal vias 192 (e.g., metal vias 164, 166, 168) extend from the third plurality of metal lines 190 to the fourth plurality of metal lines 194.

A dielectric liner layer 170 extends through the substrate along sidewalls 102c of the substrate 102 and sidewalls 112a of the STI layer 112. The dielectric liner layer 170 further extends along the back side 102b of the substrate 102. The TSV 172 extends along sidewalls 170a of the dielectric liner layer 170, through the substrate 102 and through the STI layer 112, from the back side 102b through the front side 102a.

The metal lines directly under the TSV 172 (e.g., metal lines 116, 118, 120, 122, 130, 138, 146) form the multi-level, mesh-like landing structure 180 for the TSV 172. For example, metal lines 116, 118, 120, 122, 202, 204, 206, 208 are elongated in a first direction 101y. Metal lines 130, 210 are elongated in a second direction 101x, different than (e.g., perpendicular to) the first direction 101y. Metal lines 138, 212 are elongated in the first direction 101y and laterally offset from (e.g., laterally between) metal lines 116, 118, 120, 122, 202, 204, 206. Metal lines 146, 214 are elongated in the second direction 101x and laterally offset from (e.g., laterally between) metal lines 130, 210.

Metal line 130 extends from directly under metal line 116 to directly under metal line 118. Metal line 138 extends directly under metal line 130 and is laterally between metal line 116 and metal line 118. Metal line 146 extends directly under metal line 138, extends parallel to metal line 130, and extends from directly under metal line 116 to directly under metal line 118.

The TSV 172 is on the metal lines of the landing structure 180. For example, in some embodiments, the TSV 172 is on metal line 116 and metal line 118. The TSV 172 extends directly between and along sidewalls of metal line 116 and metal line 118 to metal line 126. In some embodiments, the TSV 172 is on metal line 130, metal line 138, and metal line 146. The TSV 172 has a multi-step profile when viewed in cross-section.

Because the landing structure 180 includes multiple landing levels (e.g., the first plurality of metal lines 182, the second plurality of metal lines 186, the third plurality of metal lines 190, and the fourth plurality of metal lines 194) that are arranged in a mesh-like fashion, stress exerted on the landing structure 180 by the TSV 172 can be spread across the multiple levels and in different directions. Thus, the stress on each individual level of the landing structure 180 can be reduced. As a result, a likelihood of the landing structure 180 suffering damage due to stress from the TSV 172 can be reduced.

In some embodiments, the TSV 172 delimits a trench 174 that is filled with air or the like. For example, sidewalls 172a of the TSV 172 and an upper surface 172*b* of the TSV 172 delimit the trench 174. In some other embodiments, a dielectric layer, a passivation layer, or some other suitable layer is directly over the upper surface 172*b* and directly between the sidewalls 172*a* of the TSV 172 and fills the trench 174. A metal bump 176 (e.g., a solder bump or the like) is on a top surface of the TSV 172.

A guard ring structure 178 surrounds the TSV 172 and the landing structure 180. The guard ring structure 178 is formed by metal gates (e.g., gate 110) of transistor devices (e.g., first transistor device 104 and second transistor device 106) that surround the TSV 172, metal lines that surround the TSV (e.g., metal lines 124, 126, 132, 134, 140, 142, 148, 150), and metal vias that surround the TSV 172 (e.g., metal vias 154, 156, 160, 162, 166, 168). The metal gates, metal lines, and metal vias of the guard ring structure 178 collectively surround the landing structure 180 and the TSV 172 in a closed path. The guard ring structure 178 can protect the portion of the dielectric structure 114 surrounding the TSV 172 and the landing structure 180. Thus, a reliability of the dielectric structure 114 around the TSV 172 and the landing structure 180 can be improved.

Figure 3:
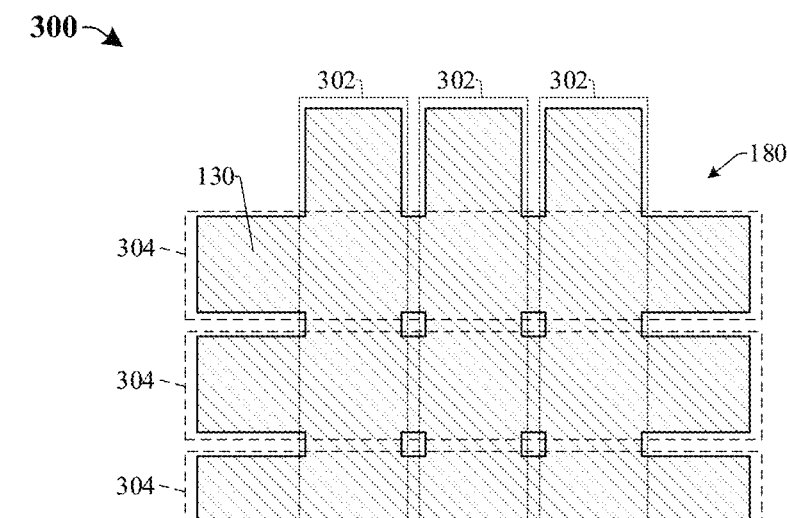
FIG. 3 and FIG. 4 illustrate top views of some embodiments of the landing structure of FIG. 1 and FIG. 2.
Figure 4:
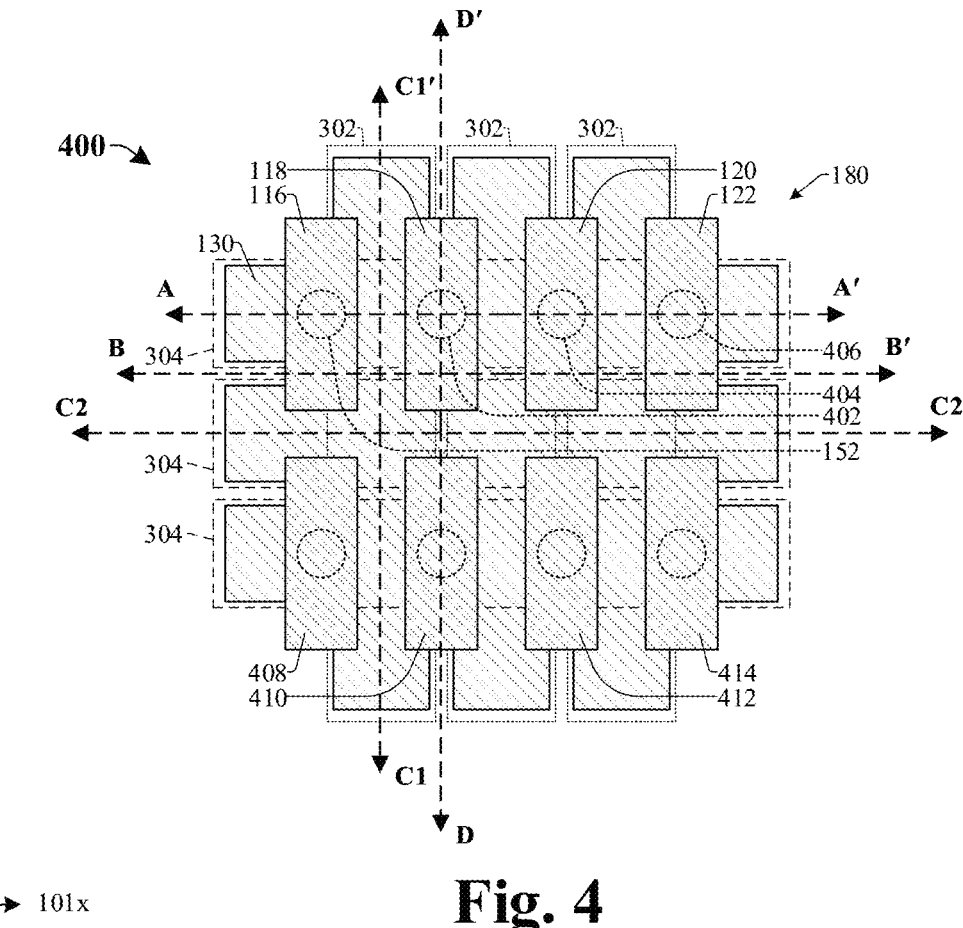

FIG. 3 illustrates top view 300 and FIG. 4 illustrates top view 400 of some embodiments of the landing structure 180 of FIG. 1 and FIG. 2 in which metal lines of the first plurality of metal lines 182 and metal line 130 of the second plurality of metal lines 186 form the multi-level, mesh-like landing structure 180. More specifically, FIG. 3 illustrates metal line 130 of the landing structure 180 and FIG. 4 further illustrates metal lines 116, 118, 120, 122 of the landing structure 180.

FIGS. 5-8 illustrate cross-sectional views 500-800 of some embodiments of an integrated chip including the landing structure 180 of FIG. 3 and FIG. 4. In some embodiments, cross-sectional view 500 of FIG. 5 may, for example, be taken across line A-A' of FIG. 4. In some embodiments, cross-sectional view 600 of FIG. 6 may, for example, be taken across line B-B' of FIG. 4. In some embodiments, cross-sectional view 700 of FIG. 7 may, for example, be taken across line C1-C1' or C2-C2' of FIG. 4. In some embodiments, cross-sectional view 800 of FIG. 8 may, for example, be taken across line D-D' of FIG. 4.

Referring to FIGS. 3-8, the landing structure 180 is formed by metal lines 116, 118, 120, 122, 408, 410, 412, 414 of the first plurality of metal lines 182 and metal line 130 of the second plurality of metal lines 186. Metal line 130 is elongated in the first direction 101*y* and the second direction 101*x*. For example, metal line 130 includes first segments 302 that are elongated in the first direction 101*y* and second segments 304 that are elongated in the second direction 101*x*. The first segments 302 intersect the second segments 304 to form a mesh-like arrangement. Metal line 130 is directly under metal lines 116, 118, 120, 122, 408, 410, 412, 414.

Metal lines 116, 118, 120, 122, 408, 410, 412, 414 are elongated in the first direction and are laterally offset from (e.g., laterally between) the first segments 302 of metal line 130. Metal vias 152, 402, 404, 406 extend between metal lines 116, 118, 120, 122 and metal line 130. The TSV 172 is on metal lines 116, 118, 120, 122 and metal line 130. The TSV extends between metal lines 116, 118, 120, 122, 408, 410, 412, 414 to metal line 130. A bottommost surface of TSV 172 is on a top surface of metal line 130.

In some embodiments, the first plurality of metal lines 182 are thicker and comprise harder metal(s) than metal lines of the second, third, or fourth plurality of metal lines 186, 190, 194. For example, in some embodiments, the first plurality of metal lines 182 comprise a first metal (e.g., tungsten or some other suitable material) and the second plurality of metal lines 186, the third plurality of metal lines 190, and the fourth plurality of metal lines 194 comprise a second metal (e.g., copper or some other suitable material) that is softer than the first metal. Because the first plurality of metal lines 182 are thicker and comprise harder metal(s), the first plurality of metal lines may better withstand stress from the TSV 172. Thus, by including metal lines of the first plurality of metal lines 182 (e.g., metal lines 116, 118, 120, 122) in the landing structure 180, the landing structure 180 may be improved.

The dielectric structure 114 includes a plurality of dielectric layers 502, 504, 506, 508, 510. A metal line 512 is under the fourth plurality of metal lines 194. A metal via 514 extends from metal line 146 to metal line 512. In some embodiments, the TSV 172 is coupled to metal line 512. In some embodiments, dielectric layers 504, 506, 508 comprise ELK dielectrics (e.g., a Si—O—C—H dielectric or the like) or some other suitable material. As shown in FIGS. 5-8, the guard ring structure 178 surrounds portions of dielectric layers 504, 506, 508 around the TSV 172 and the landing structure 180 to protect dielectric layers 504, 506, 508 around the TSV 172 and the landing structure 180. Although the guard ring structure 178 is not shown in FIG. 3 and FIG. 4, it will be appreciated that the guard ring structure 178 surrounds the landing structure 180 illustrated in FIG. 3 and FIG. 4 (e.g., as shown in FIG. 1).

Figure 9:
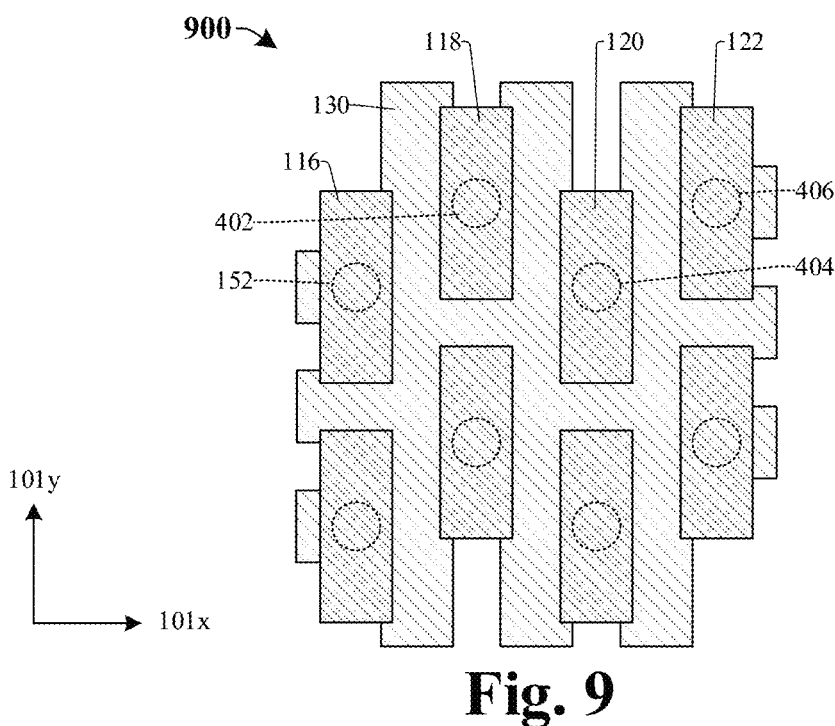
FIG. 9 illustrates a top view of some other embodiments of the landing structure of FIG. 4.

FIG. 9 illustrates a top view 900 of some other embodiments of the landing structure 180 of FIG. 4. Metal lines 116, 118, 120, 122 are offset from each other along the first direction 101*y* in an alternating fashion. Further, metal line 130 has a mesh-like pattern that extends between metal lines 116, 118, 120, 122. Metal lines 116, 118, 120, 122 are shown as partially transparent in FIG. 9 so that metal line 130 can be seen.

Figure 5:
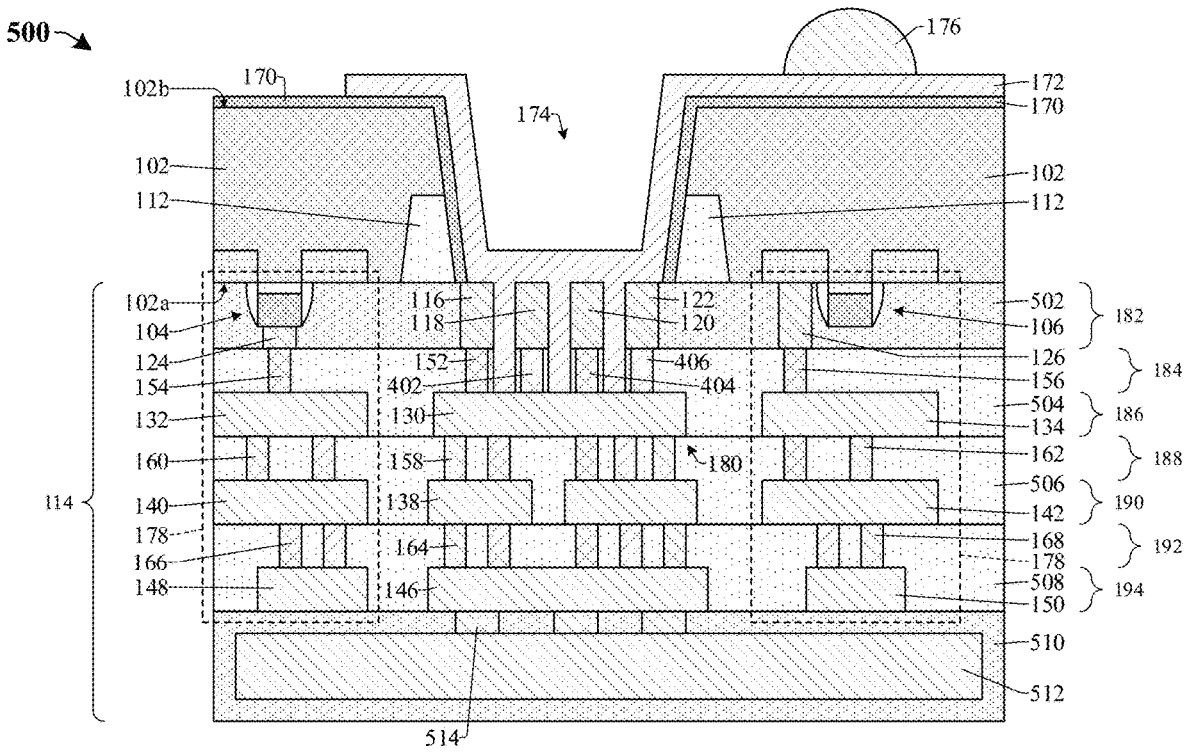
FIGS. 5-8 illustrate cross-sectional views of some embodiments of an integrated chip including the landing structure of FIG. 3 and FIG. 4.
Figure 6:
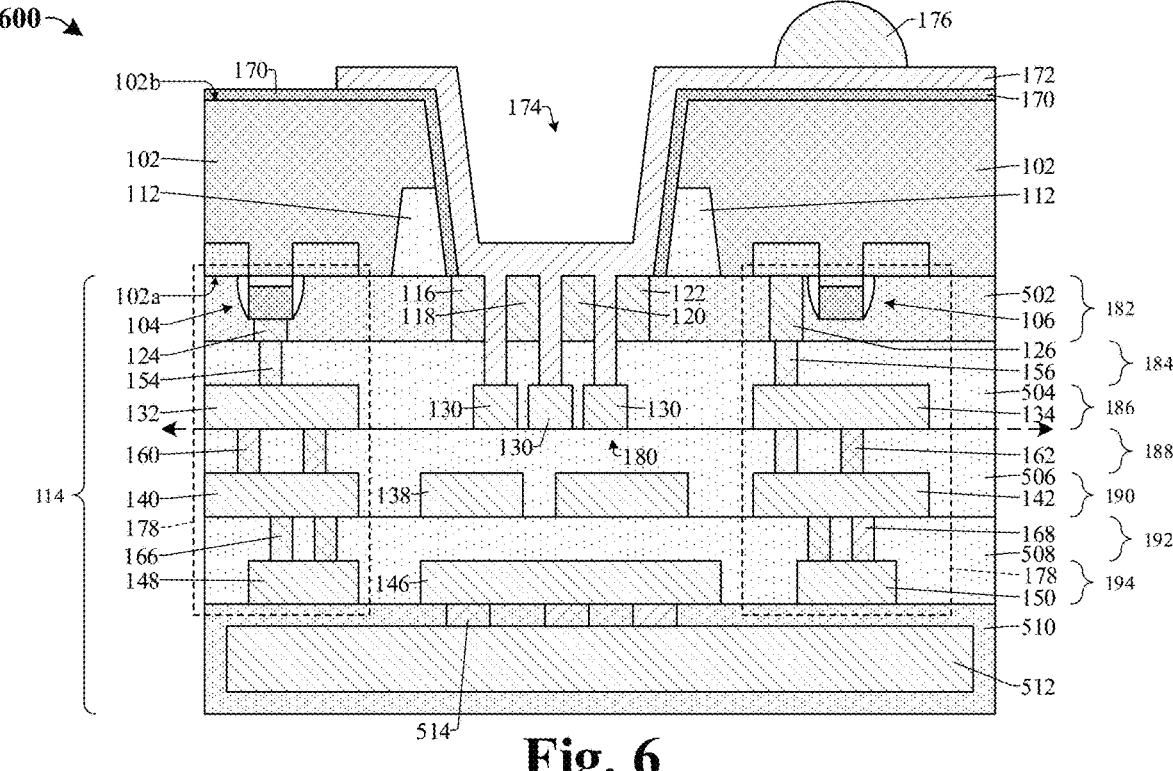
Figure 7:
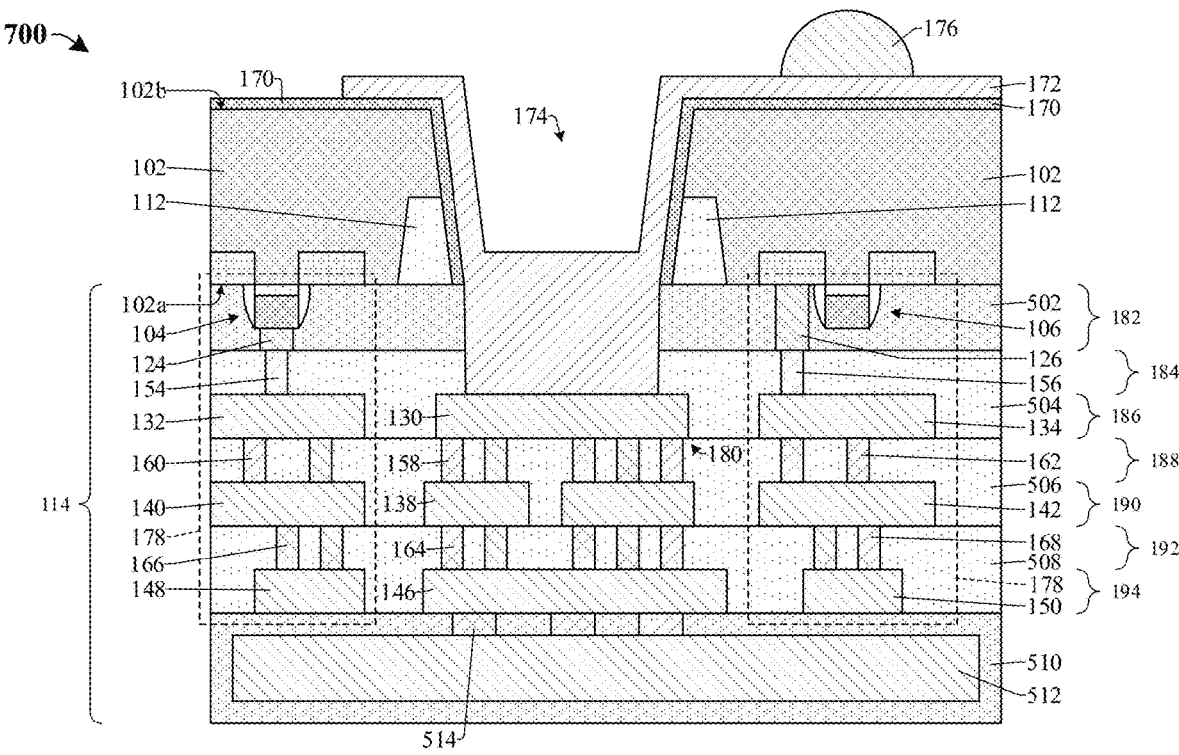
Figure 8:
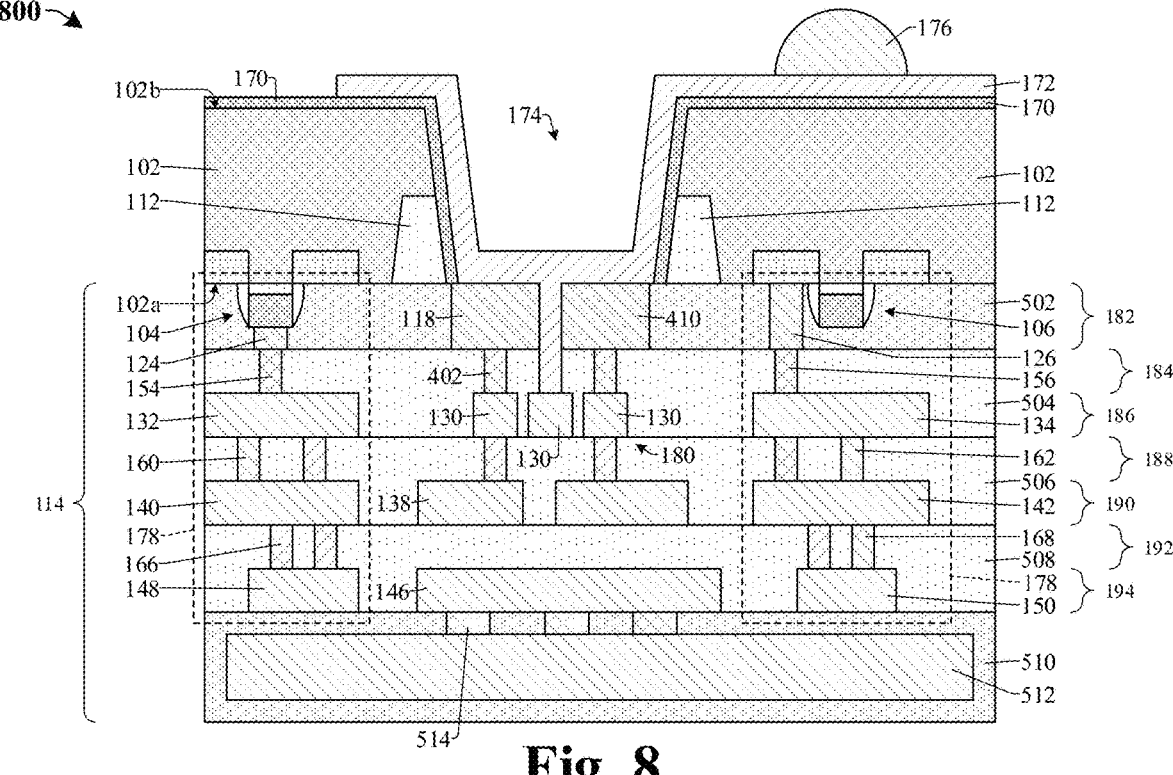
Figure 10:
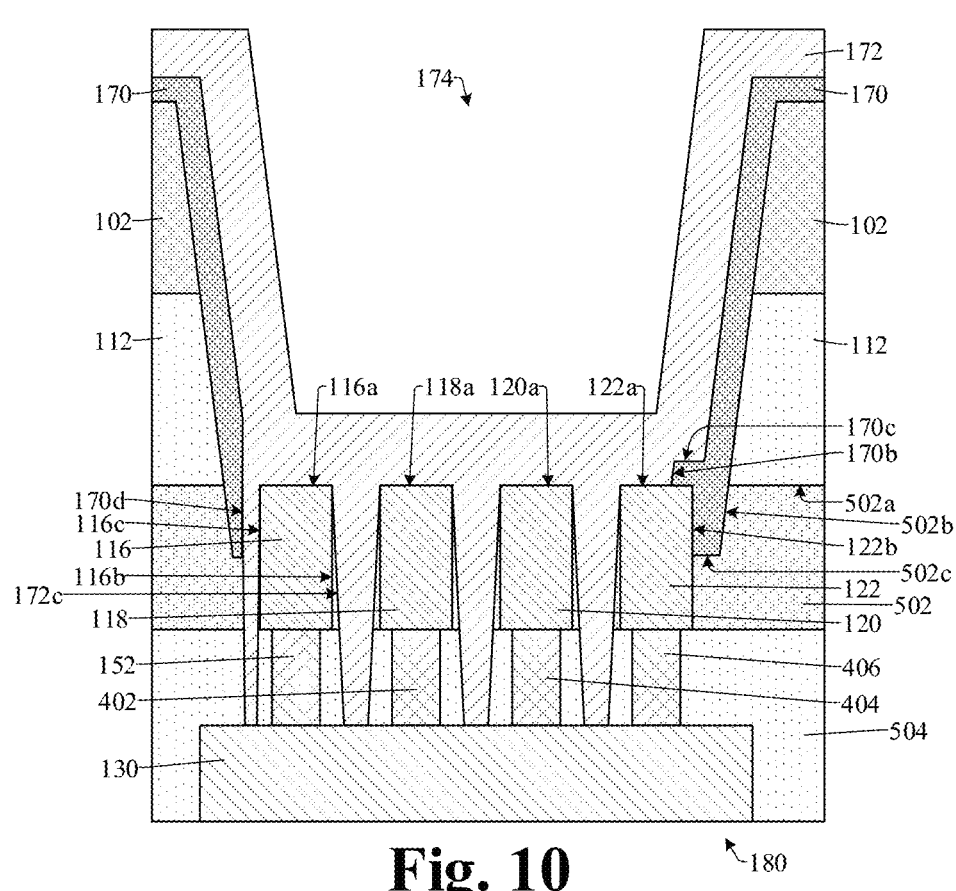
FIG. 10 illustrates a cross-sectional view of some other embodiments of the TSV and the landing structure of FIG. 5.

FIG. 10 illustrates a cross-sectional view 1000 of some other embodiments of the TSV 172 and the landing structure 180 of FIG. 5.

In some embodiments, the dielectric liner layer 170 extends laterally on a top surface of metal line 130. A sidewall 170*b* of the dielectric liner layer 170 is directly over metal line 130. An upper surface 170*c* of the dielectric liner layer 170 is directly over metal line 130.

In some embodiments, the dielectric liner layer 170 extends below top surfaces 116*a*, 118*a*, 120*a*, 122*a* of metal lines 116, 118, 120, 122, and below a top surface 502*a* of dielectric layer 502. The dielectric liner layer 170 is on a sidewall 122*b* of metal line 122, a sidewall 502*b* of dielectric layer 502, and an upper surface 502*c* of dielectric layer 502. In some embodiments, the TSV 172 extends directly between a sidewall 116*c* of metal line 116 and sidewall 170*d* of the dielectric liner layer 170.

Dielectric layer 502 is directly between sidewalls of the TSV 172 and sidewalls of metal vias 152, 402, 404, 406. In some embodiments, a width of the TSV 172 tapers with a depth of the TSV 172. Dielectric layer 502 is directly between a sidewall 172*c* of the TSV 172 and a sidewall 116*b* of metal line 116.

Figure 11:
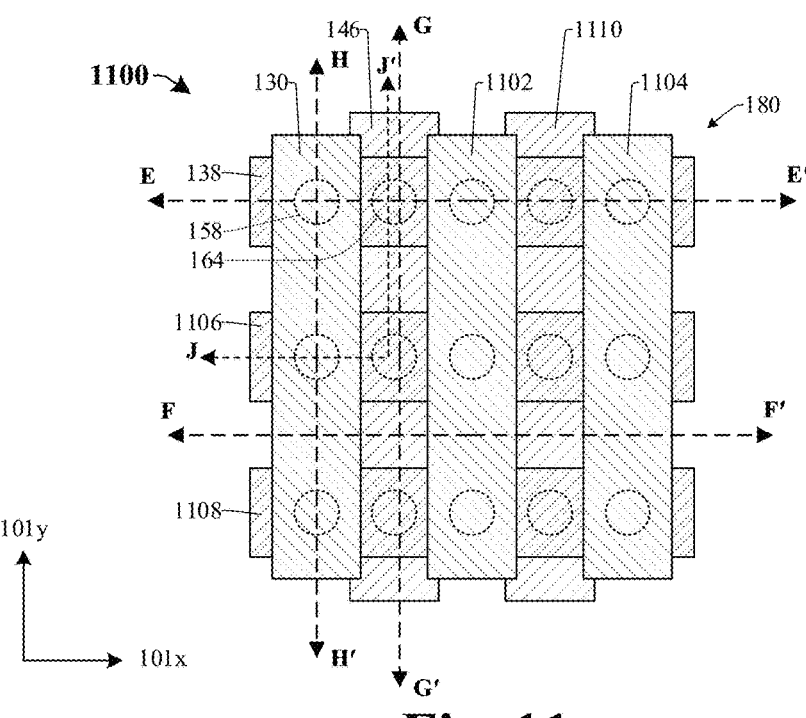
FIG. 11 illustrates a top view of some embodiments of the landing structure of FIG. 1 and FIG. 2.
Figure 12:
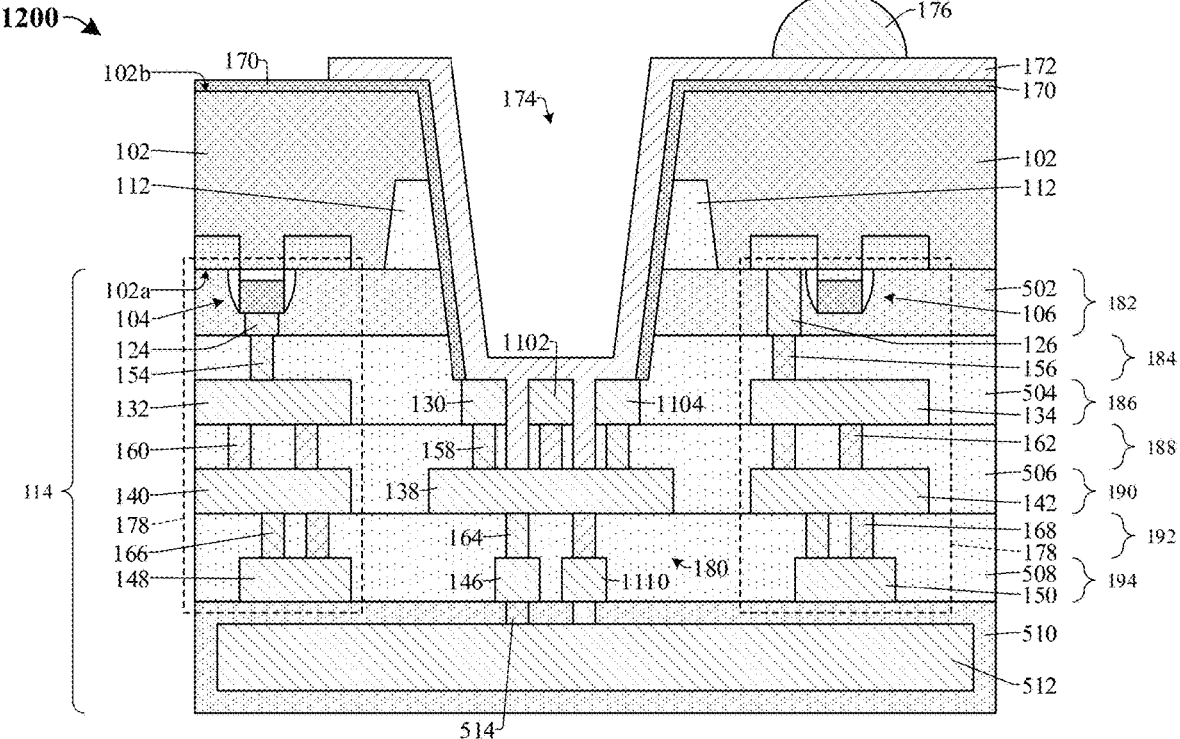
FIGS. 12-16 illustrate cross-sectional views of some embodiments of an integrated chip including the landing structure of FIG. 11.
Figure 13:
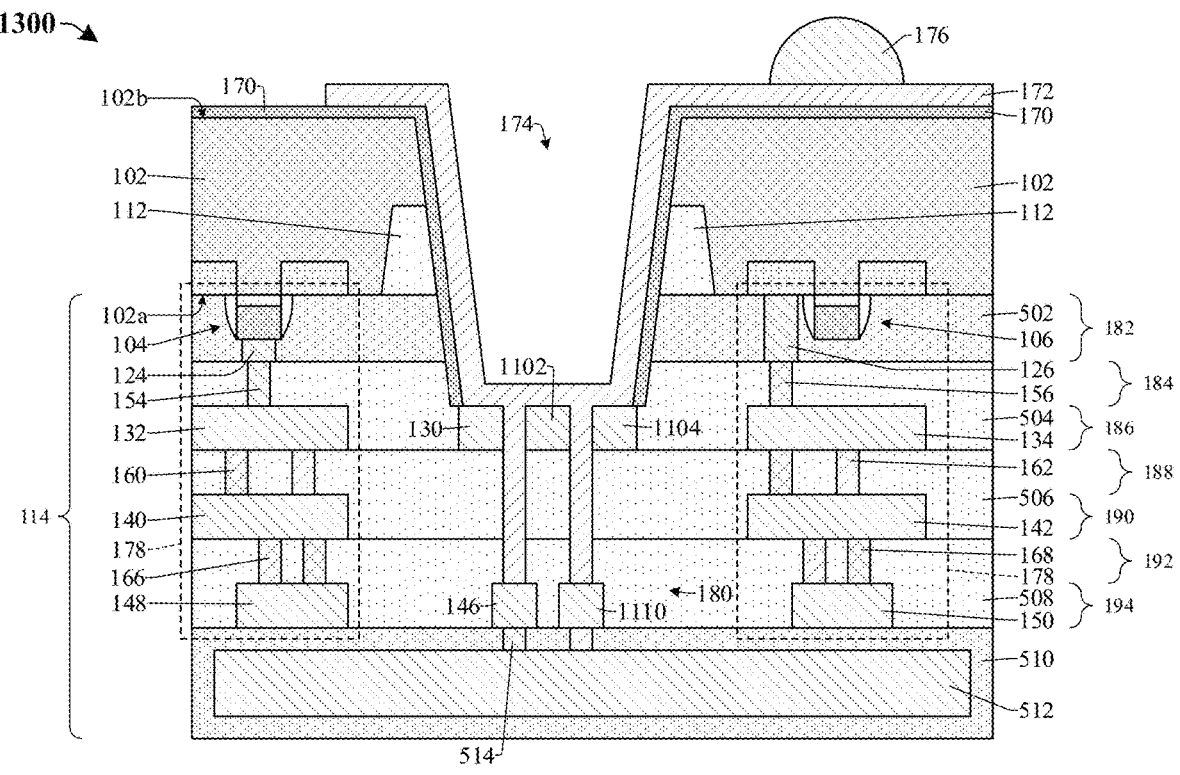
Figure 14:
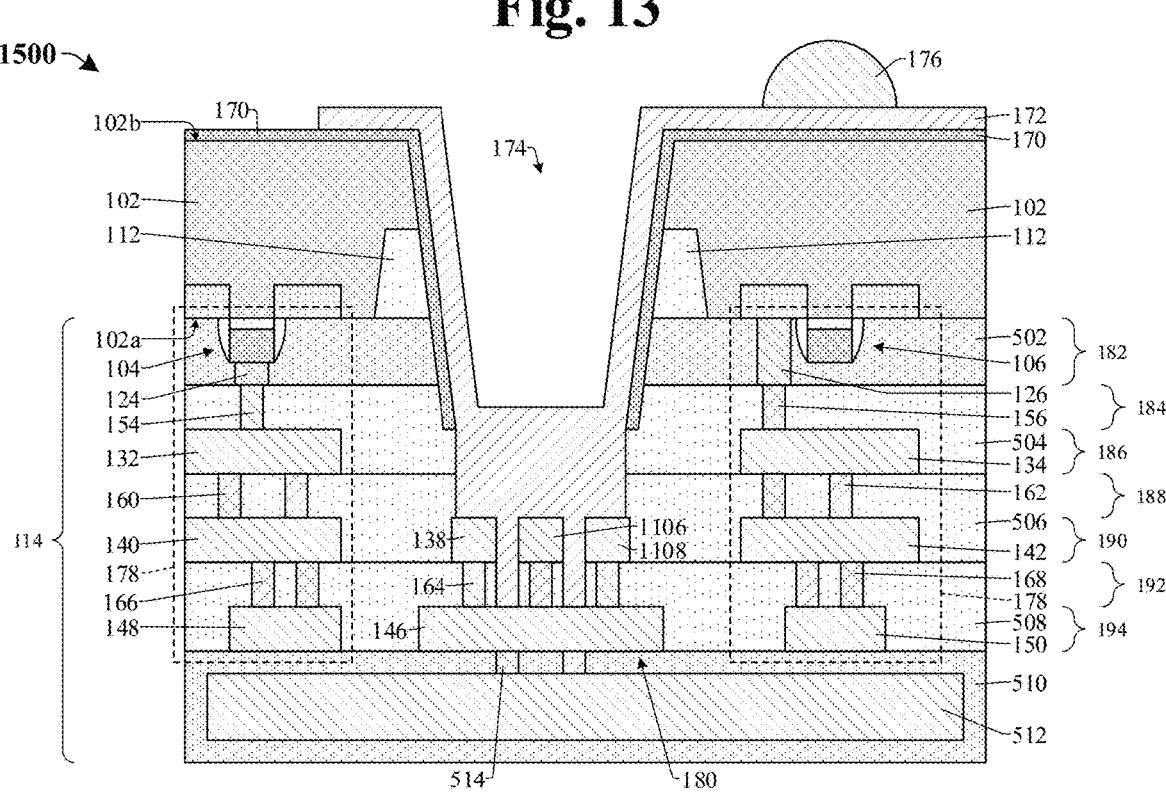
Figure 15:
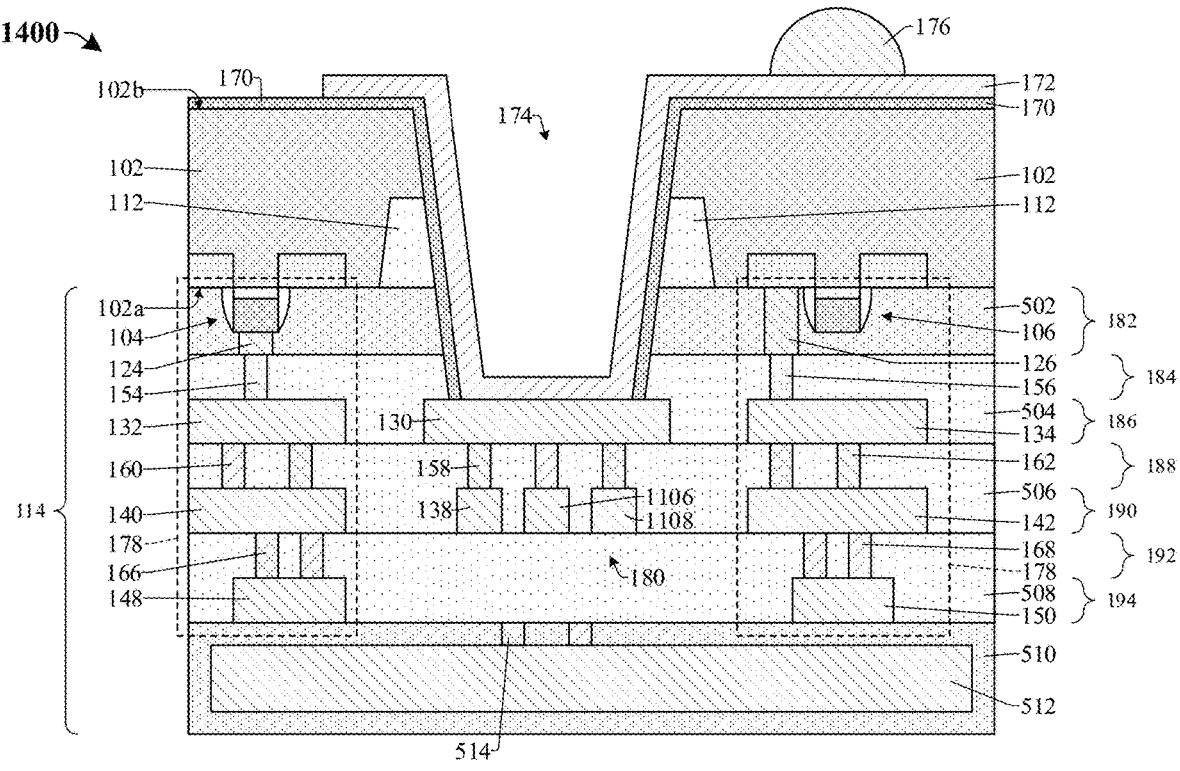

FIG. 11 illustrates a top view 1100 of some embodiments of the landing structure 180 of 1 and FIG. 2 in which metal lines of the second plurality, the third plurality, and the fourth of metal lines 186, 190, 194 form the multi-level, mesh-like landing structure 180. FIGS. 12-16 illustrate cross-sectional views 1200-1600 of some embodiments of an integrated chip including the landing structure of FIG. 11. In some embodiments, cross-sectional view 1200 of FIG. 12 may, for example, be taken across line E-E' of FIG. 11. In some embodiments, cross-sectional view 1300 of FIG. 13 may, for example, be taken across line F-F' of FIG. 11. In some embodiments, cross-sectional view 1400 of FIG. 14 may, for example, be taken across line G-G' of FIG. 11. In some embodiments, cross-sectional view 1500 of FIG. 15 may, for example, be taken across line H-H' of FIG. 11. In some embodiments, cross-sectional view 1600 of FIG. 16 may, for example, be taken across line J-J' of FIG. 11.

Referring to FIGS. 11-16, the landing structure 180 is formed by metal lines of the second plurality of metal lines 186 (e.g., metal lines 130, 1102, 1104), metal lines of the third plurality of metal lines 190 (e.g., metal lines 138, 1106, 1108), and metal lines of the fourth plurality of metal lines 194 (e.g., metal lines 146, 1110). Metal lines 130, 1102, 1104 are elongated in the first direction 101y. Metal lines 138, 1106, 1108 are elongated in the second direction 101x. Metal lines 146, 1110 are elongated in the first direction and laterally offset from (e.g., laterally between) metal lines 130, 1102, 1104. The TSV 172 is on metal lines 130, 1102, 1104, 138, 1106, 1108, 146, 1110. The TSV 172 extends between metal lines 130, 1102, 1104 to metal lines 138, 1106, 1108, and between metal lines 138, 1106, 1108 to metal lines 146, 1110. Because the landing structure 180 has an increased number of levels, stress exerted on the landing structure 180 by the TSV may be more spread out. Thus, the landing structure 180 may be improved.

The upper surface 172b of TSV 172 that delimits the trench 174 is below dielectric layer 502 and below a top surface of dielectric layer 504. The dielectric liner layer 170 extends below dielectric layer 502 and below the top surface of dielectric layer 504.

Although the guard ring structure 178 is not shown in FIG. 11, it will be appreciated that the guard ring structure 178 surrounds the landing structure 180 illustrated in FIG. 11 (e.g., as shown in FIG. 1).

Figure 16:
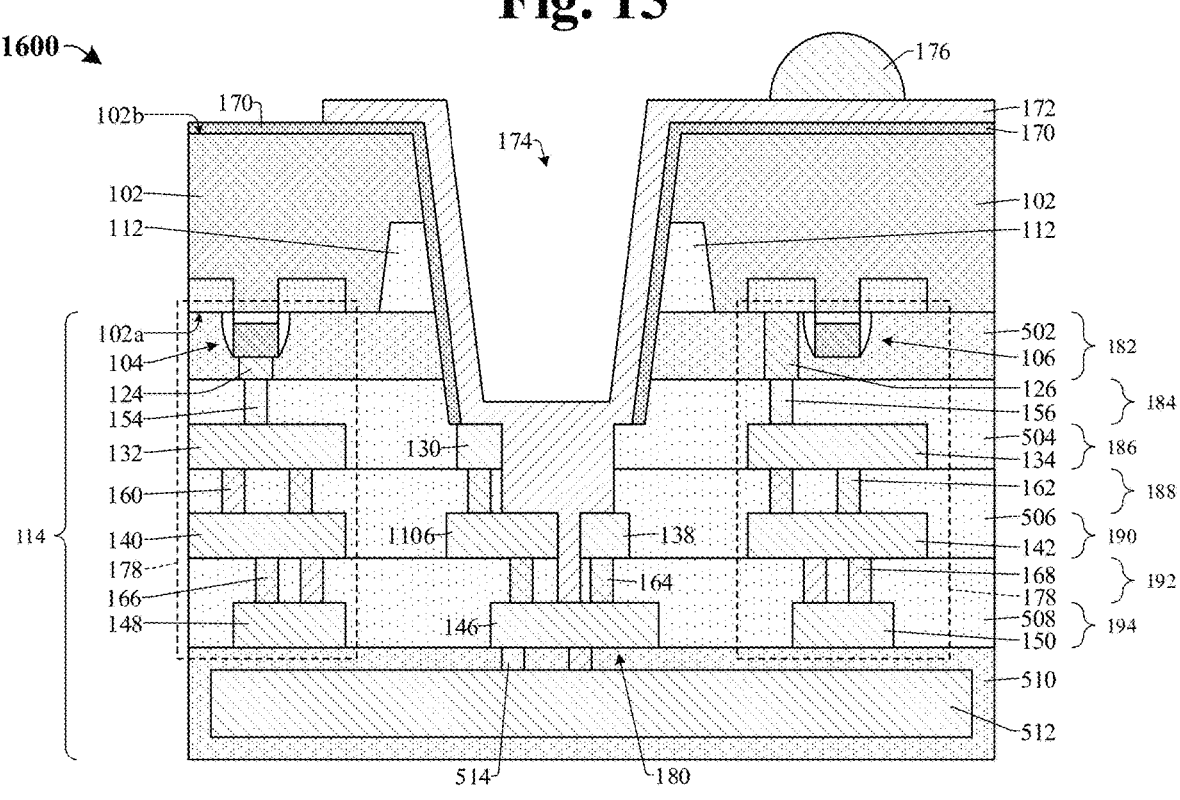
Figure 17:
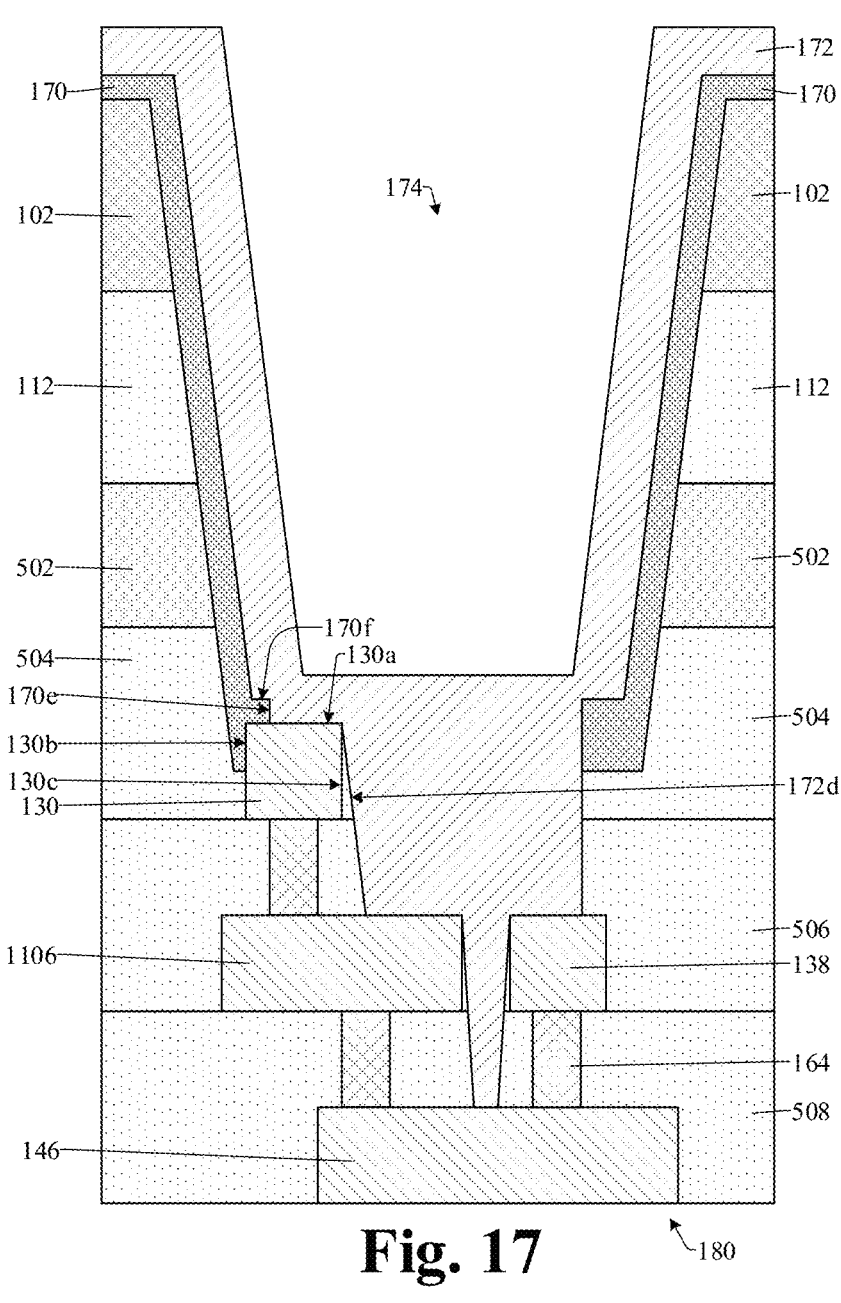
FIG. 17 illustrates a cross-sectional view of some other embodiments of the TSV and the landing structure of FIG. 16.

FIG. 17 illustrates a cross-sectional view 1700 of some other embodiments of the TSV 172 and the landing structure 180 of FIG. 16.

In some embodiments, the dielectric liner layer 170 extends laterally on a top surface 130a of metal line 130. A sidewall 170e and an upper surface 170f of the dielectric liner layer 170 are directly over metal line 130. In some embodiments, the dielectric liner layer 170 extends below the top surface 130a of metal line 130. The dielectric liner layer 170 is on a sidewall 130b of metal line 130. In some embodiments, dielectric layer 502 is directly between a sidewall 130c of metal line 130 and a sidewall 172d of the TSV 172.

FIGS. 18-26 illustrate cross-sectional views 1800-2600 of some embodiments of a method for forming an integrated chip comprising a multi-level landing structure 180 and a TSV 172 on the landing structure 180.

FIGS. 27-35 illustrate cross-sectional views 2700-3500 of some other embodiments of a method for forming an integrated chip comprising a multi-level landing structure 180 and a TSV 172 on the landing structure 180.

Although FIGS. 18-26 and FIGS. 27-35 are described in relation to methods, it will be appreciated that the structures disclosed in FIGS. 18-26 and FIGS. 27-35 are not limited to such methods, but instead may stand alone as structures independent of the methods.

Figure 18:
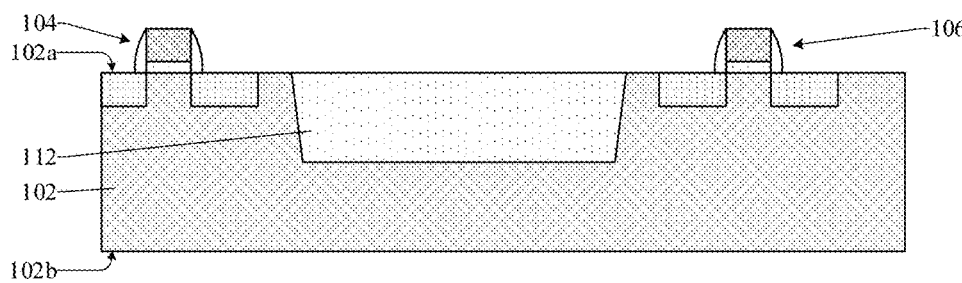
FIGS. 18-26 illustrate cross-sectional views of some embodiments of a method for forming an integrated chip comprising a multi-level landing structure and a TSV on the landing structure.
Figure 27:
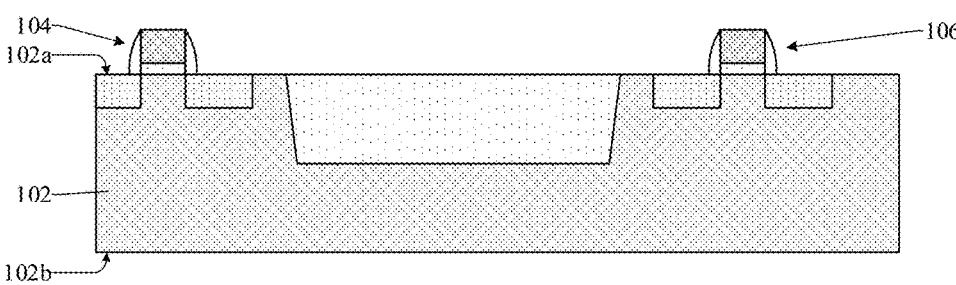
FIGS. 27-35 illustrate cross-sectional views of some other embodiments of a method for forming an integrated chip comprising a multi-level landing structure and a TSV on the landing structure.

As shown in cross-sectional view 1800 of FIG. 18 and cross-sectional view 2700 of FIG. 27, transistor devices 104, 106 and an STI layer 112 are formed along a front side 102a of a semiconductor substrate 102. In some embodiments, the semiconductor substrate 102 comprises silicon, silicon germanium, or some other suitable material. In some embodiments, the transistor devices 104, 106 are or comprise bipolar junction transistors (BJTs), metal oxide semiconductor field effect transistors (MOSFETs), junction field effect transistors (JFETs), fin field effect transistors (Fin FETs), gate all around field effect transistors (GAA FETs), or the like. In some embodiments, the STI layer 112 comprises silicon dioxide or some other suitable material.

Figure 19:
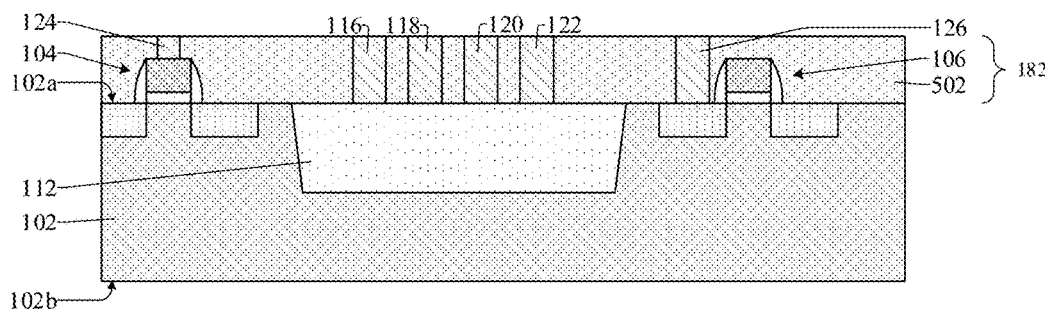
Figure 28:
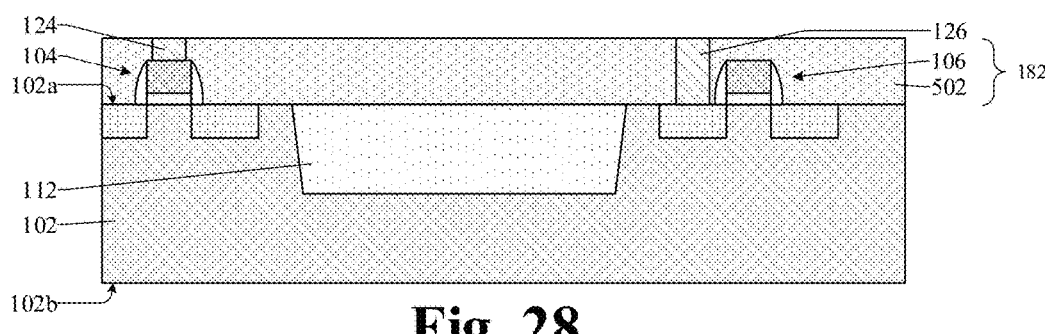

As shown in cross-sectional view 1900 of FIG. 19 and cross-sectional view 2800 of FIG. 28, a dielectric layer 502 and a first plurality of metal lines 182 are formed along the front side 102a of the substrate 102 to partially form a landing structure 180 and a guard ring structure 178.

Metal lines 124, 126 of the first plurality of metal lines 182 are formed on (e.g., contacting) the transistor devices 104, 106. In some embodiments, metal lines 116, 118, 120, 122 of the first plurality of metal lines 182 are formed between the transistor devices 104, 106 and directly over the STI layer 112, as shown in FIG. 19.

In some embodiments, dielectric layer 502 comprises silicon dioxide or some other suitable material. In some embodiments, dielectric layer 502 may be deposited by a chemical vapor deposition (CVD) process, a physical vapor deposition (PVD) process, an atomic layer deposition (ALD) process, or some other suitable process.

In some embodiments, the first plurality of metal lines 182 comprise tungsten or some other suitable material. In some embodiments, the first plurality of metal lines 182 are formed by depositing dielectric layer 502 over the front side 102a of the substrate 102, patterning dielectric layer 502, and depositing (e.g., by a CVD process, a PVD process, an ALD process, or some other suitable process) a metal (e.g., tungsten or some other suitable material) over the patterned dielectric layer 502 to form the first plurality of metal lines 182. In some other embodiments, the first plurality of metal lines 182 are formed by depositing the metal over the front side 102a of the substrate 102, patterning the metal to form the first plurality of metal lines 182, and depositing dielectric layer 502 over and between the first plurality of metal lines 182.

Figure 20:
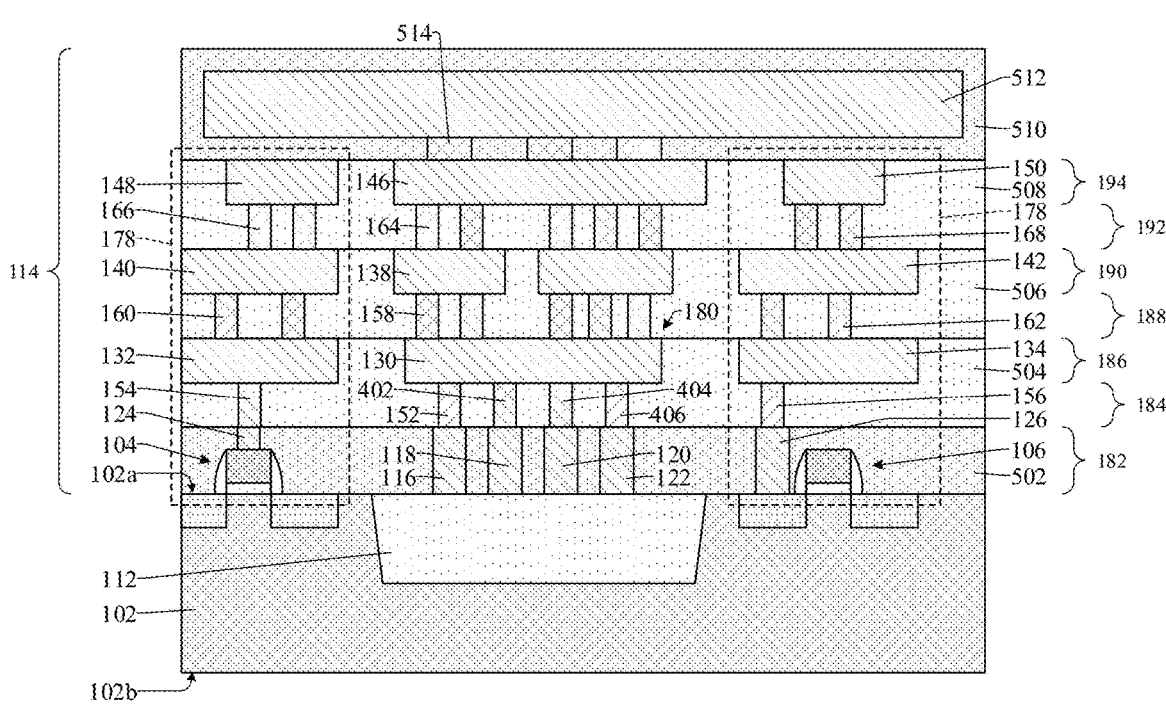
Figure 29:
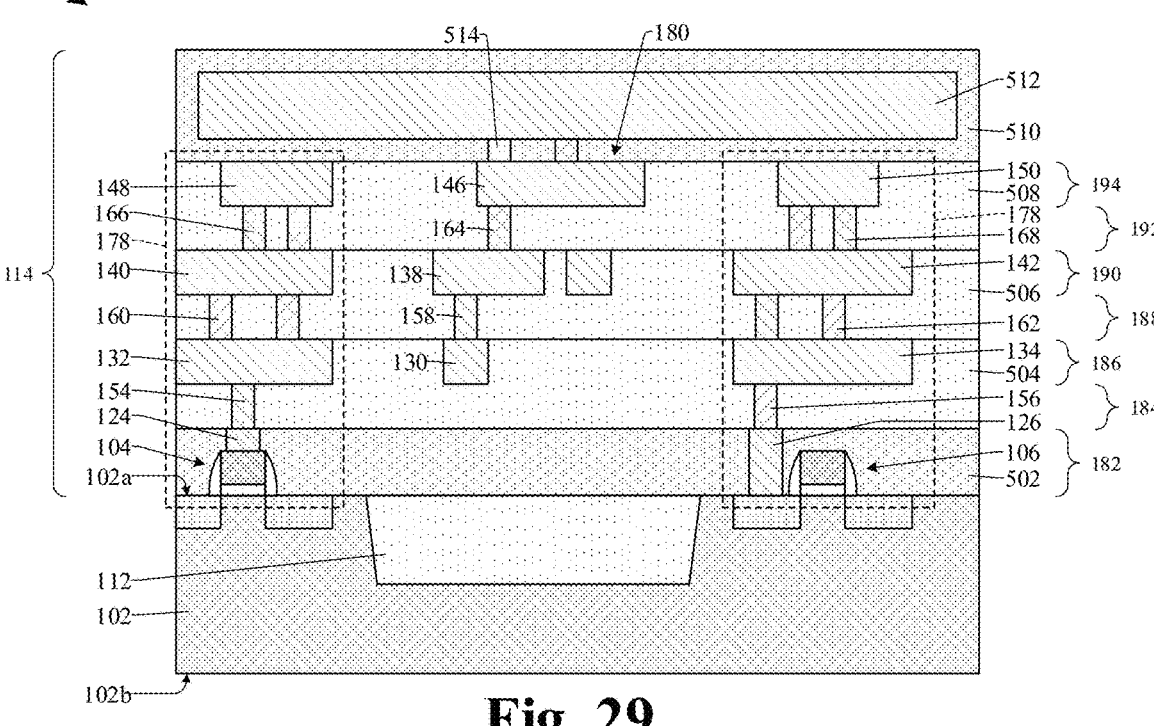

As shown in cross-sectional view 2000 of FIG. 20 and cross-sectional view 2900 of FIG. 29, dielectric layers 504, 506, 508, 510, a second plurality of metal lines 186, a third plurality of metal lines 190, a fourth plurality of metal lines 194, a first plurality of metal vias 184, a second plurality of metal vias 188, a third plurality of metal vias 192, metal via 514, and metal line 512 are formed over dielectric layer 502 and over the first plurality of metal lines 182 to further from the landing structure 180 and the guard ring structure 178.

In some embodiments, dielectric layers 504, 506, 508 comprise an ELK dielectric (e.g., an Si—O—C—H dielectric or the like) or some other suitable material deposited by a CVD process, a PVD process, an ALD process, or some other suitable process. In some embodiments, dielectric layer 510 comprises a low-k dielectric (e.g., a carbon doped oxide or the like) or some other suitable material deposited by a CVD process, a PVD process, an ALD process, or some other suitable process.

In some embodiments, the second plurality of metal lines 186, the third plurality of metal lines 190, the fourth plurality of metal lines 194, the first plurality of metal vias 184, the second plurality of metal vias 188, the third plurality of metal vias 192, metal via 514, and/or metal line 512 comprise copper or some other suitable material deposited by a CVD process, a PVD process, an ALD process, or some other suitable process.

Figure 21:
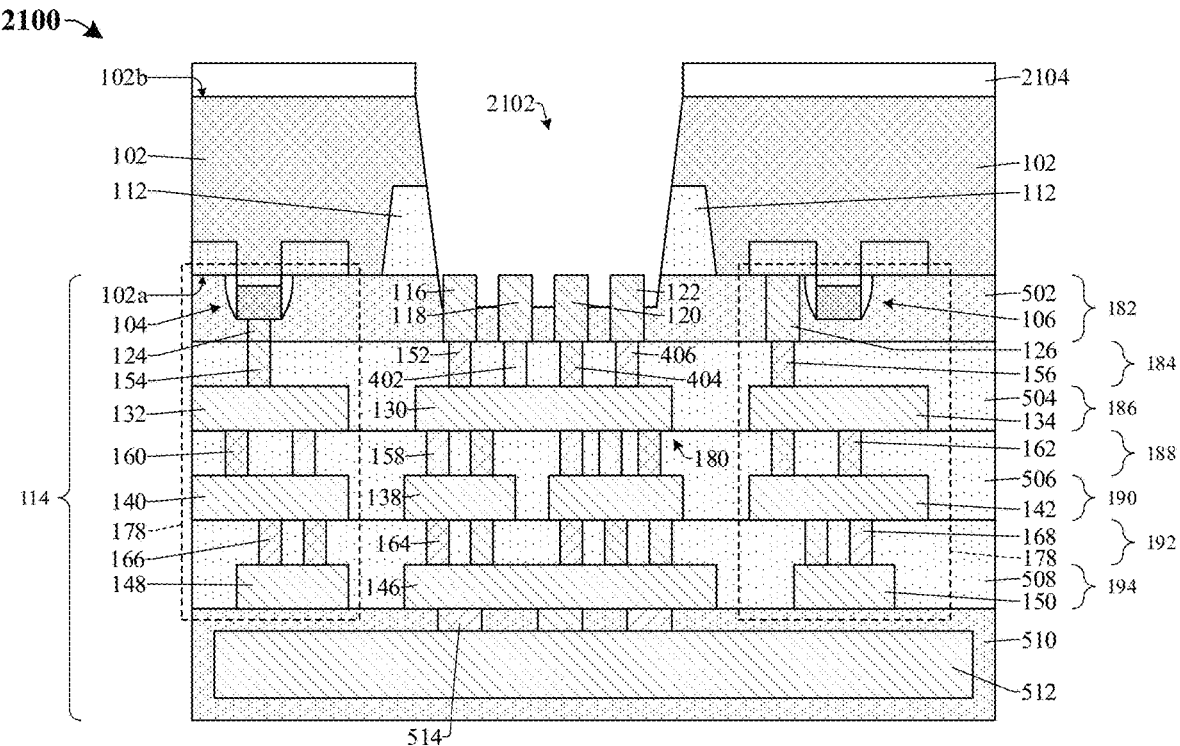
Figure 30:
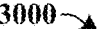
Figure 30:
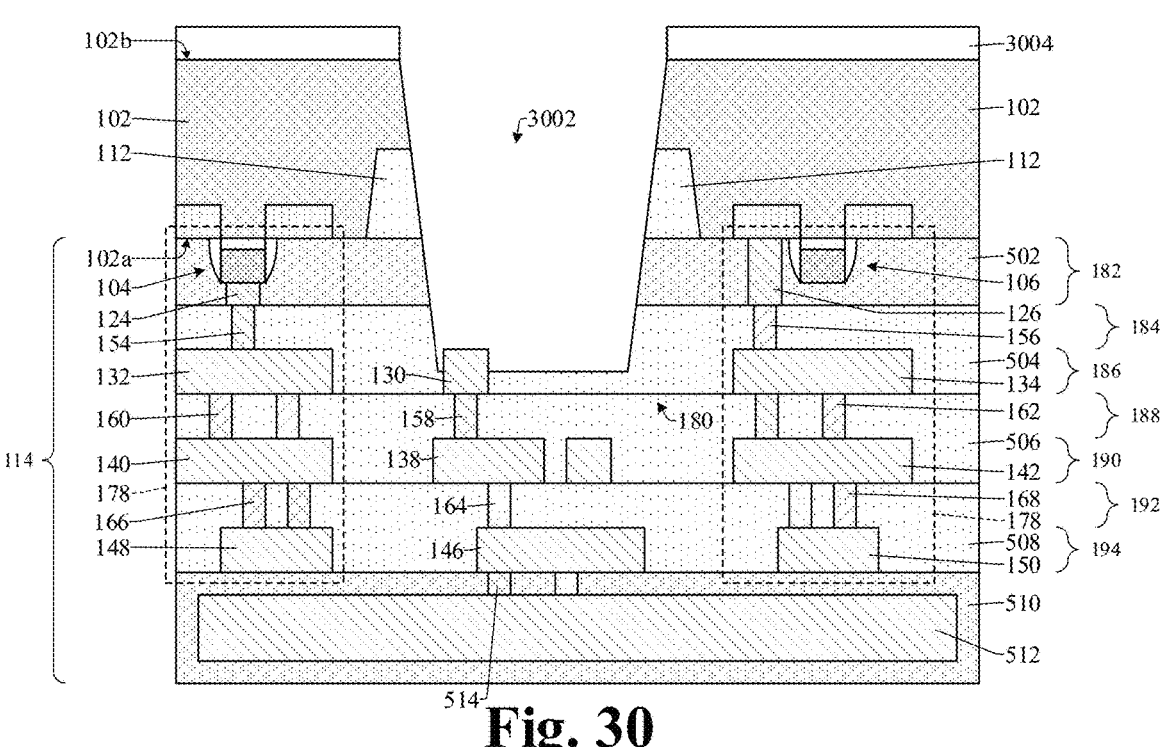

As shown in cross-sectional view 2100 of FIG. 21 and cross-sectional view 3000 of FIG. 30, a back side 102b of the substrate 102, opposite the front side 102*a*, and the STI layer 112 are etched to form a trench (e.g., trench 2102 of FIG. 21 or trench 3002 of FIG. 30) in the substrate 102 and the STI layer 112. The etching (and the trench 2102, 3002) extends from the back side 102*b*, through the substrate 102, to the front side 102*a*. In some embodiments, the etching extends into dielectric layer 502, as shown in FIG. 21 and FIG. 30. In some embodiments, the extends further extends through dielectric layer 502 and into dielectric layer 504, as shown in FIG. 30.

In some embodiments, the trench 2102 is delimited by sidewalls of the substrate 102, sidewalls of the STI layer 112, sidewalls and upper surface(s) of dielectric layer 502, and sidewalls and upper surfaces of metal lines of the first plurality of metal lines 182, as shown in FIG. 21. In some embodiments, the trench 3002 is delimited by sidewalls of the substrate 102, sidewalls of the STI layer 112, sidewalls of dielectric layer 502, sidewalls and upper surface(s) of dielectric layer 502, and sidewalls and upper surfaces of metal lines of the second plurality of metal lines 186, as shown in FIG. 30.

In some embodiments, the etching comprises a dry etching process (e.g., a reactive ion etching process, a plasma etching process, an ion beam etching process, or the like) or some other suitable process. In some embodiments, a masking layer (e.g., masking layer 2104 of FIG. 21 or masking layer 3004 of FIG. 30) is formed over the back side 102*b* of the substrate 102 and the etching is performed according to the masking layer 2104, 3004. In some embodiments, the masking layer 2104, 3004 comprises a photoresist layer, a hard mask layer, or some other suitable layer.

Figure 22:
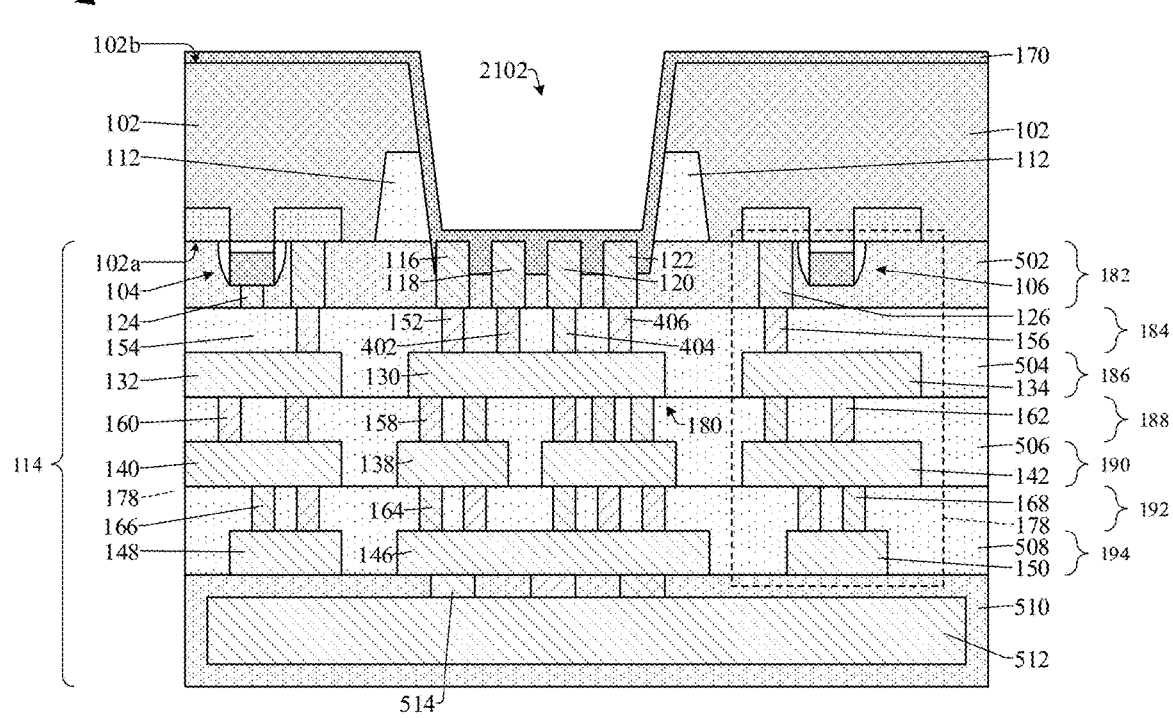
Figure 31:
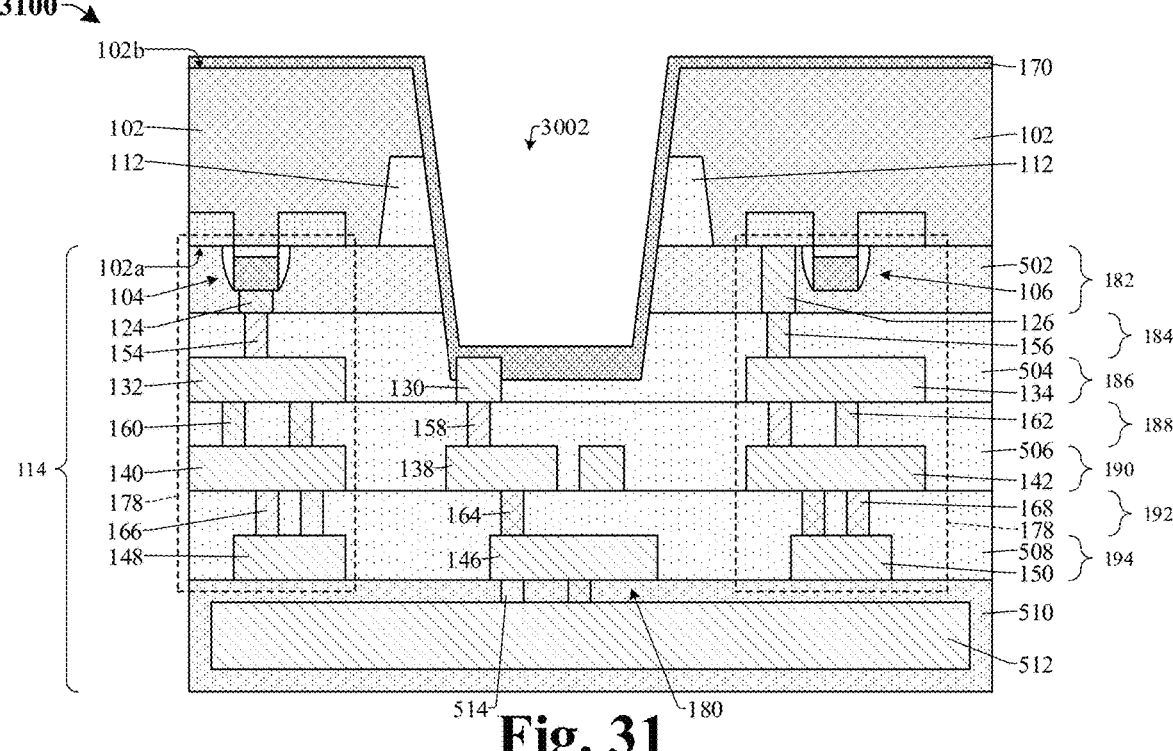

As shown in cross-sectional view 2200 of FIG. 22 and cross-sectional view 3100 of FIG. 31, a dielectric liner layer 170 is deposited over the back side 102*b* of the substrate 102 and in the trench 2102, 3002 so the dielectric liner layer 170 lines the back side 102*b* of the substrate 102, the sidewalls of the substrate 102 that delimit the trench 2102, 3002, and the sidewalls of the STI layer 112 that delimit the trench 2102, 3002. In embodiments where the trench 2102, 3002 extends into dielectric layer 502 or dielectric layer 504, the dielectric liner layer 170 is further deposited on those layers.

In some embodiments, the dielectric liner layer 170 comprises silicon dioxide, silicon nitride, or some other suitable material and is deposited by a CVD process, a PVD process, an ALD process, or some other suitable process.

Figure 23:
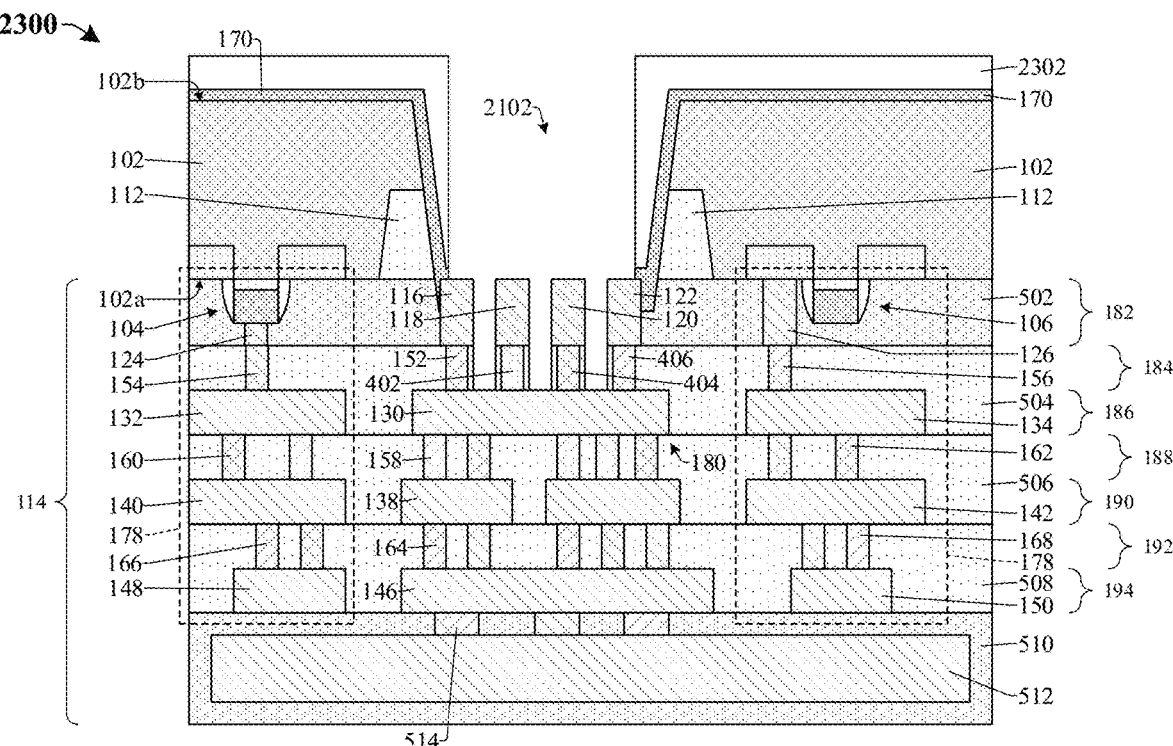
Figures 32, 33:
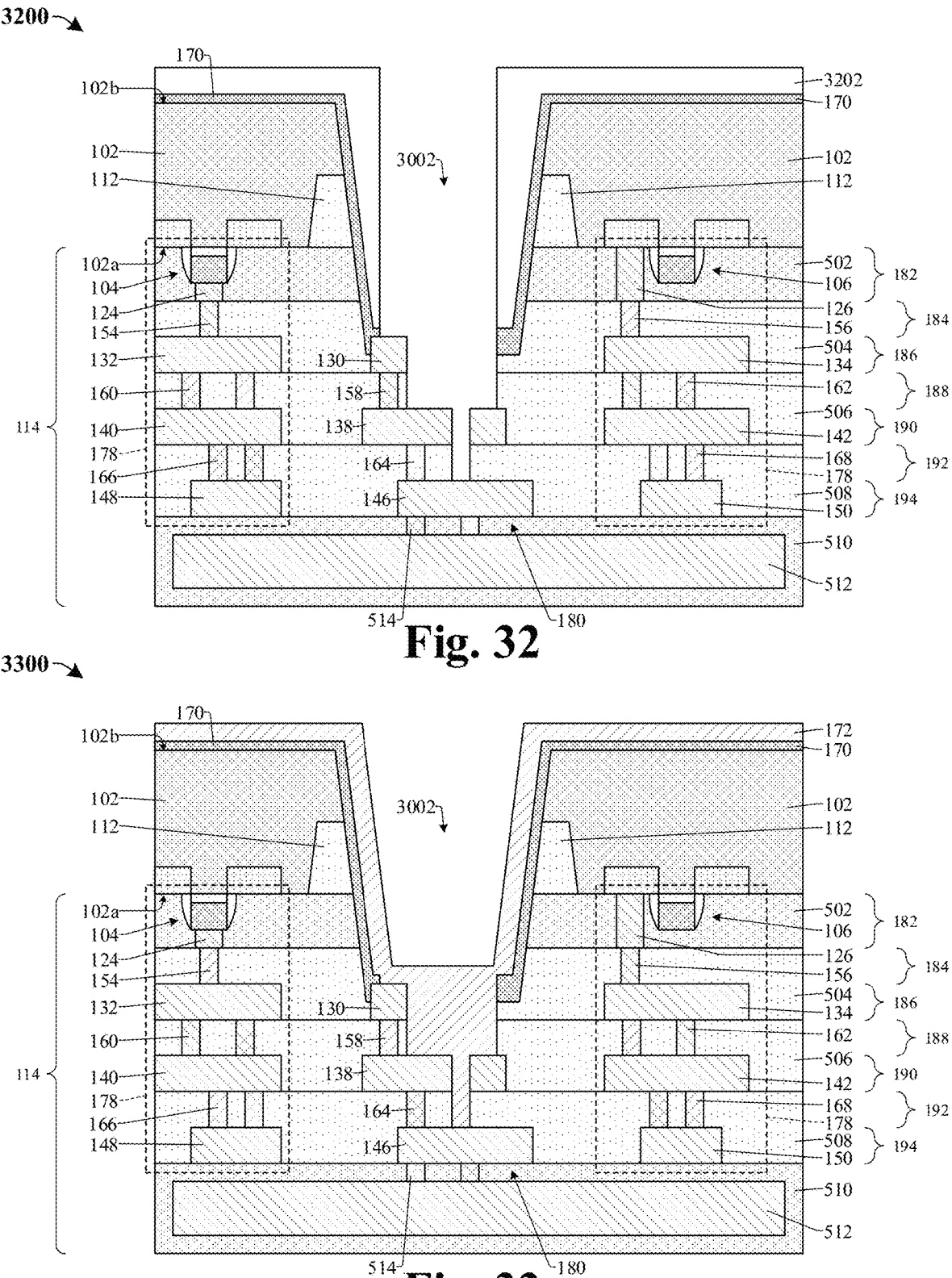

As shown in cross-sectional view 2300 of FIG. 23 and cross-sectional view 3200 of FIG. 32, the dielectric liner layer 170 and the dielectric structure 114 (e.g., dielectric layer 502 and/or dielectric layer 504) are etched at the bottom of the trench 2102, 3002 to remove the dielectric liner layer 170 from an upper surface of the dielectric structure (e.g., an upper surface of dielectric layer 502 or an upper surface of dielectric layer 504) and to extend the trench 2102, 3002. In some embodiments, extending the trench 2102 uncovers metal line 130, as shown in FIG. 23. In some embodiments, extending the trench 3002 uncovers metal lines of the third plurality and the fourth plurality of metal lines 190, 194, as shown in FIG. 32.

In some embodiments, the etching (and the trench 2102) extends to a first depth (e.g., to metal line 130) below the front side 102*a* of the substrate 102. In some other embodiments, the etching (and the trench 3002) extends to a second depth (e.g., to metal line 138) and a third depth (e.g., to metal line 146) below the front side 102*a* of the substrate 102.

In some embodiments, the etching comprises a dry etching process or some other suitable process. In some embodiments, a masking layer (e.g., masking layer 2302 of FIG. 23 or masking layer 3202 of FIG. 32) is formed over the dielectric liner layer 170 and the etching is performed according to the masking layer 2302, 3202.

Figure 24:
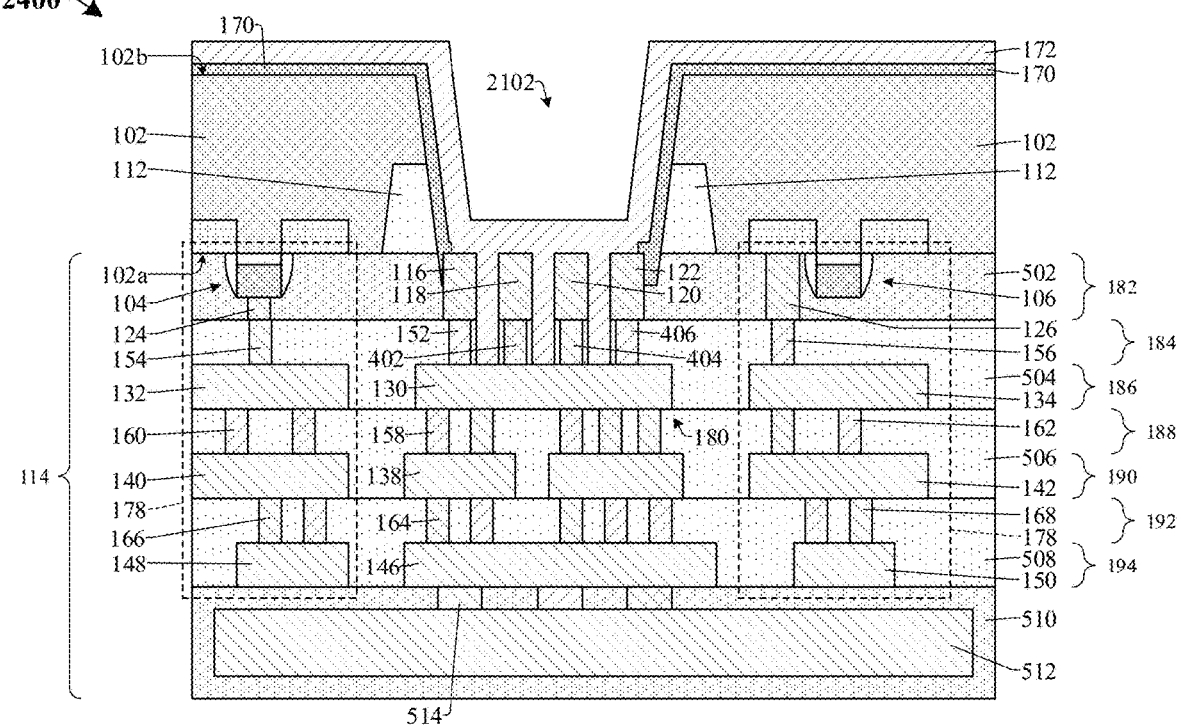

As shown in cross-sectional view 2400 of FIG. 24 and cross-sectional view 3300 of FIG. 33, a TSV 172 is formed over the back side 102*b* of the substrate 102 and in the trench 2102, 3002. The TSV 172 partially fills the trench 2102, 3002. In some embodiments, the TSV 172 is formed on metal lines of the first plurality of metal lines 182 and metal line 130 of the second plurality of metal lines 186. In some other embodiments, the TSV 172 is formed on metal lines of the first plurality, the second plurality, and the third plurality of metal lines 186, 190, 194.

In some embodiments, forming the TSV 172 comprises depositing a metal (e.g., copper or some other suitable material) or some other suitable material over the back side 102*b* of the substrate 102 and in the trench 2102, 3002 by a CVD process, a PVD process, an ALD process, or some other suitable process. In some embodiments, a remainder of the trench 2102, 3002 is filled with air or the like. In some embodiments, a dielectric layer, a passivation layer, or the like is deposited over the TSV 172 to fill the remainder of the trench 2102, 3002.

Figure 25:
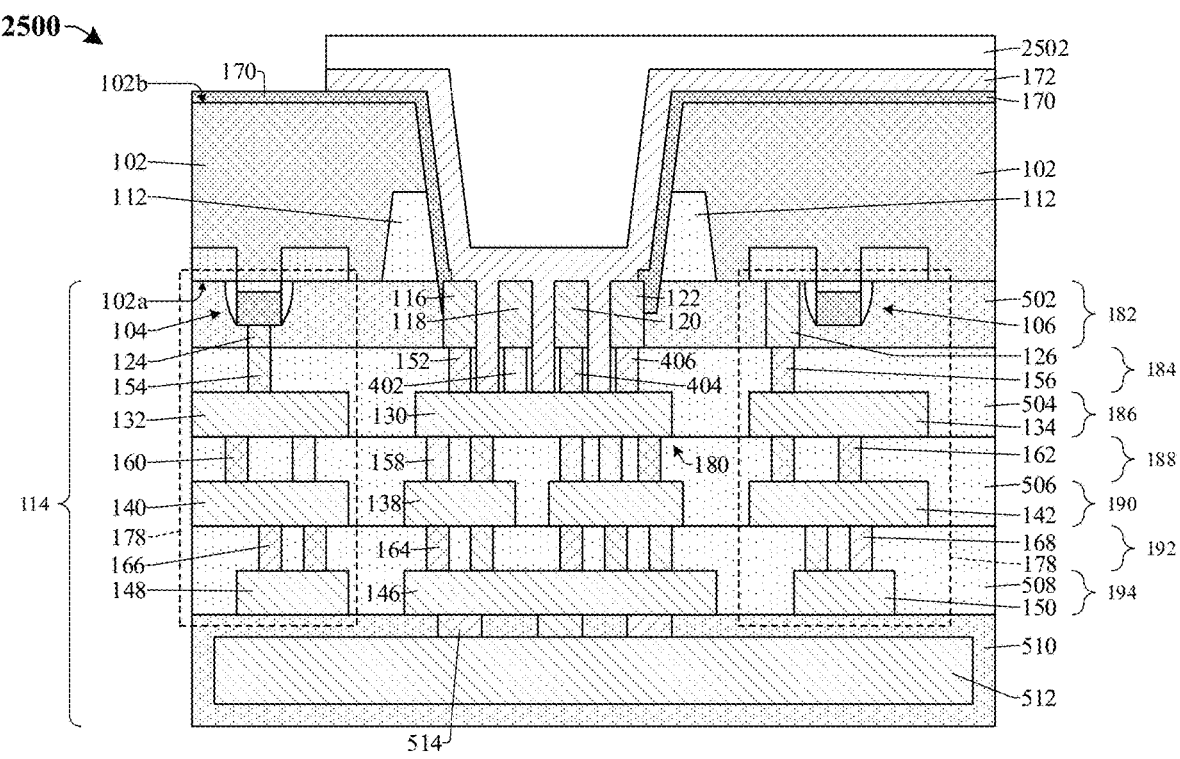
Figures 34, 35:
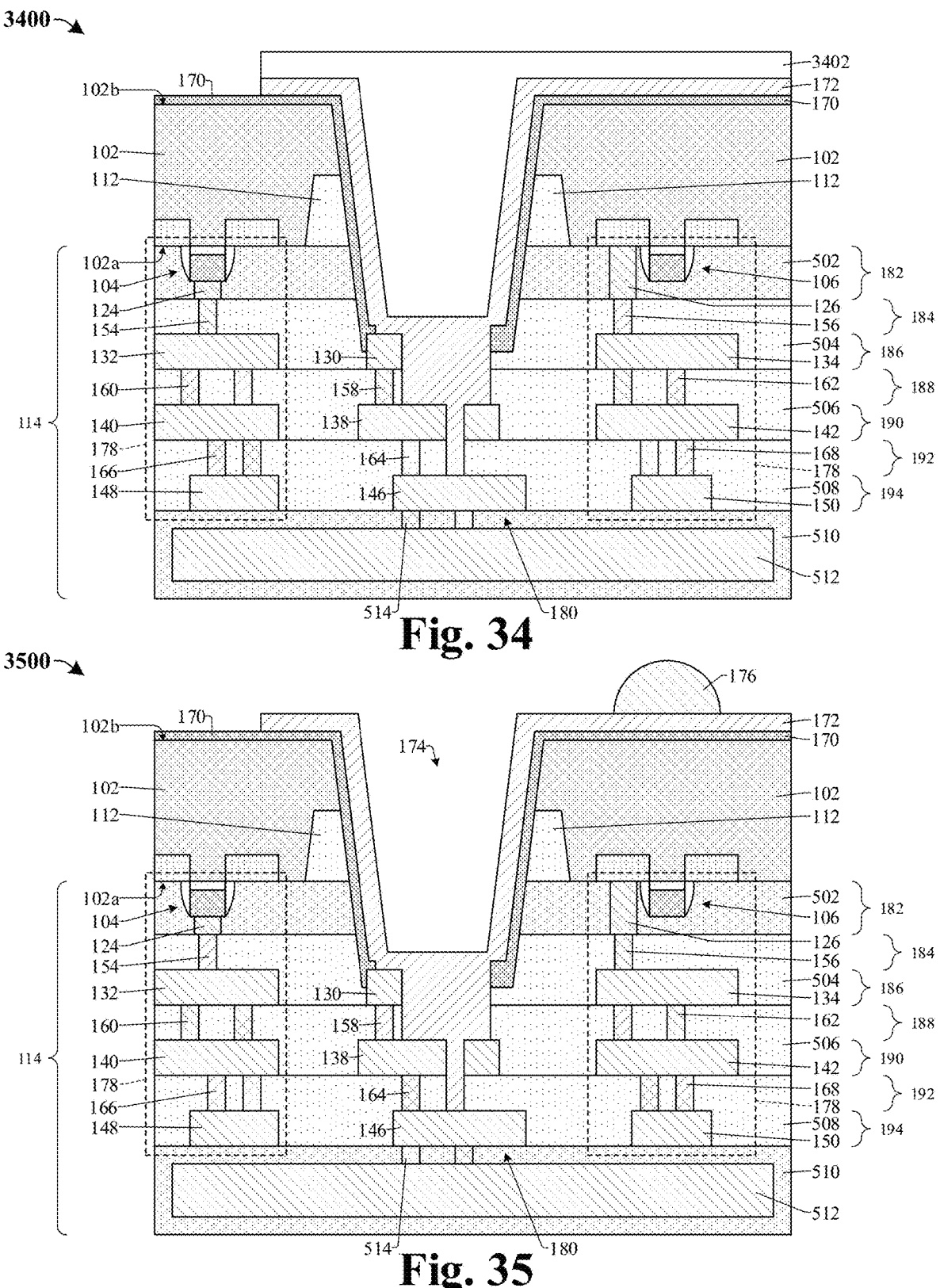

As shown in cross-sectional view 2500 of FIG. 25 and cross-sectional view 3400 of FIG. 34, the TSV 172 is etched to remove a portion of the TSV 172 from over the back side 102*b* of the substrate 102. The etching further delimits the TSV 172. In some embodiments, the etching comprises a dry etching process or some other suitable process. In some embodiments, a masking layer (e.g., masking layer 2502 of FIG. 25 or masking layer 3402 of FIG. 34) is formed over the TSV 172 and the etching is performed according to the masking layer 2502, 3402.

Figure 26:
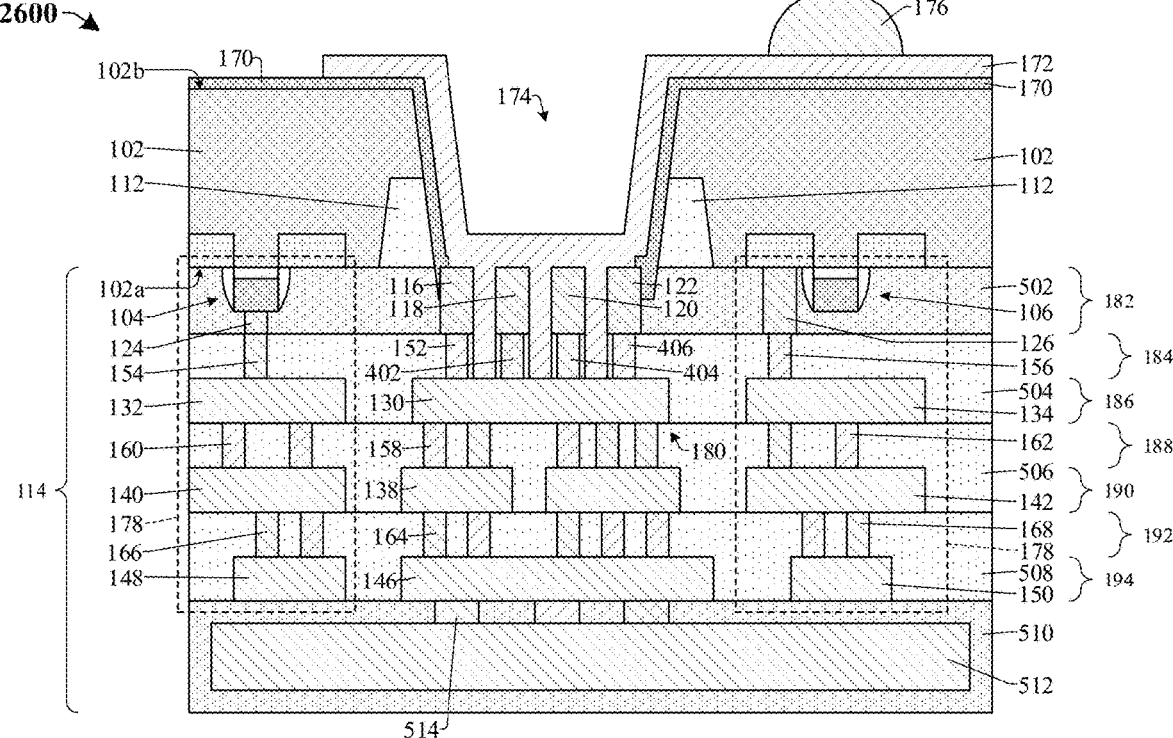

As shown in cross-sectional view 2600 of FIG. 26 and cross-sectional view 3500 of FIG. 35, a metal bump 176 is formed over the TSV 172. In some embodiments, the metal bump 176 comprises solder, gold, or some other suitable material.

FIG. 36 illustrates a flow diagram of some embodiments of a method 3600 for forming an integrated chip including a landing structure and a TSV on the landing structure. While method 3600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At block 3602, form transistors along a front side of a substrate. FIG. 18 illustrates a cross-sectional view 1800 and FIG. 27 illustrates a cross-sectional view 2700 of some embodiments corresponding to block 3602.

At block 3604, form a dielectric structure over the front side of the substrate. FIG. 19 illustrates a cross-sectional view 1900 and FIG. 28 illustrates a cross-sectional view 2800 of some embodiments corresponding to block 3604.

At block 3606, form a first metal line within the dielectric structure. FIG. 20 illustrates a cross-sectional view 2000 and FIG. 29 illustrates a cross-sectional view 2900 of some embodiments corresponding to block 3606.

At block 3608, form a second metal line within the dielectric structure and over the first metal line. The first metal line and the second metal line form the landing structure. FIG. 20 illustrates a cross-sectional view 2000 and FIG. 29 illustrates a cross-sectional view 2900 of some embodiments corresponding to block 3608.

At block 3610, form a guard ring structure including a plurality of metal lines, metal vias, and metal gates collectively surrounding the first metal line and the second metal line. FIG. 20 illustrates a cross-sectional view 2000 and FIG. 29 illustrates a cross-sectional view 2900 of some embodiments corresponding to block 3610.

At block 3612, etch a back side of the substrate to form a trench in the substrate extending through the substrate. FIG. 21 illustrates a cross-sectional view 2100 and FIG. 30 illustrates a cross-sectional view 3000 of some embodiments corresponding to block 3612.

At block 3614, deposit a dielectric liner layer over the back side of the substrate and in the trench. FIG. 22 illustrates a cross-sectional view 2200 and FIG. 31 illustrates a cross-sectional view 3100 of some embodiments corresponding to block 3614.

At block 3616, etch the dielectric liner layer and the dielectric structure at a bottom of the trench to extend the trench into the dielectric structure to the first metal line and the second metal line. FIG. 23 illustrates a cross-sectional view 2300 and FIG. 32 illustrates a cross-sectional view 3200 of some embodiments corresponding to block 3616.

At block 3618, form a through-substrate via (TSV) over the back side of the substrate and in the trench on the first metal line and the second metal line. FIG. 24 illustrates a cross-sectional view 2400 and FIG. 33 illustrates a cross-sectional view 3300 of some embodiments corresponding to block 3618.

At block 3620, etch the TSV to remove a portion of the TSV from over the back side of the substrate. FIG. 25 illustrates a cross-sectional view 2500 and FIG. 34 illustrates a cross-sectional view 3400 of some embodiments corresponding to block 3620.

At block 3622, form a metal bump on the TSV. FIG. 26 illustrates a cross-sectional view 2600 and FIG. 35 illustrates a cross-sectional view 3500 of some embodiments corresponding to block 3622.

Thus, the present disclosure relates to an integrated chip and a method for forming the integrated chip, the integrated chip including a multi-level mesh-like landing structure and a TSV on the landing structure.

Accordingly, in some embodiments, the present disclosure relates to an integrated chip including a semiconductor substrate having a first side and a second side, opposite the first side. A first transistor and a second transistor are along the first side of the semiconductor substrate. A dielectric structure including a plurality of dielectric layers is under the first side of the semiconductor substrate. A first metal line is within the dielectric structure. A second metal line is within the dielectric structure and under the first metal line. A first metal via extends between the first metal line and the second metal line. A through-substrate via (TSV) extends from the second side of the semiconductor substrate, through the semiconductor substrate between the first transistor and the second transistor, to the first metal line and the second metal line.

In other embodiments, the present disclosure relates to an integrated chip including a semiconductor substrate having a first side and a second side, opposite the first side. A first transistor and a second transistor are arranged along the first side of the semiconductor substrate. A shallow trench isolation (STI) layer is between the first transistor and the second transistor. The STI layer extends into the semiconductor substrate along the first side of the semiconductor substrate. A dielectric structure including a plurality of dielectric layers is under the first side of the semiconductor substrate. A landing structure is within the dielectric structure. The landing structure includes a first metal line within the dielectric structure. The first metal line is elongated in a first direction. The landing structure includes a second metal line within the dielectric structure and laterally spaced from the first metal line. The second metal line is elongated in the first direction. The landing structure includes a third metal line within the dielectric structure and under the first metal line and the second metal line. The third metal line is elongated in a second direction, different than the first direction. A first metal via is within the dielectric structure and extends from the first metal line to the third metal line. A second metal via is within the dielectric structure and extends from the second metal line to the third metal line. A through-substrate via (TSV) extends laterally from the first metal line to the second metal line, extends vertically between the first metal line and the second metal line to the third metal line, and extends from the first metal line, the second metal line, and the third metal line, through the semiconductor substrate and the STI layer, to the second side of the semiconductor substrate.

In yet other embodiments, the present disclosure relates to a method for forming an integrated chip. A first transistor and a second transistor are formed along a first side of a semiconductor substrate. A dielectric structure including a plurality of dielectric layers is formed over the first side of the semiconductor substrate. A first metal line is formed within the dielectric structure. A first metal via is formed within the dielectric structure and over the first metal line. A second metal line is formed within the dielectric structure and over the first metal via. The first metal line and the second metal line form a landing structure. A first etching process is performed into a second side of the semiconductor substrate, opposite the first side, to form a trench in the semiconductor substrate. The trench extends through the semiconductor substrate from the second side to the first side. The trench is formed by a pair of sidewalls of the semiconductor substrate. A second etching process is performed into the dielectric structure directly below the trench to extend the trench so the trench is further formed by the dielectric structure, the first metal line, and the second metal line. A through-substrate via (TSV) is formed over the second side of the semiconductor substrate, along the pair of sidewalls of the semiconductor substrate, on the first metal line, and on the second metal line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method for forming an integrated chip, the method comprising:
   forming a first transistor and a second transistor along a first side of a semiconductor substrate;

forming a dielectric structure comprising a plurality of dielectric layers over the first side of the semiconductor substrate;

forming a first metal line within the dielectric structure;

forming a first metal via within the dielectric structure and over the first metal line;

forming a second metal line within the dielectric structure and over the first metal via, wherein the first metal line and the second metal line form a landing structure;

performing a first etching process into a second side of the semiconductor substrate, opposite the first side, to form a trench in the semiconductor substrate, the trench extending through the semiconductor substrate from the second side to the first side, wherein the trench is delimited by a pair of sidewalls of the semiconductor substrate;

performing a second etching process into the dielectric structure directly below the trench to extend the trench so the trench is further delimited by the dielectric structure, the first metal line, and the second metal line; and forming a through-substrate via (TSV) over the second side of the semiconductor substrate, along the pair of sidewalls of the semiconductor substrate, on the first metal line, and on the second metal line.

2. The method of claim 1, wherein the first metal line is formed directly between a gate of the first transistor and a gate of the second transistor.

3. The method of claim 1, further comprising:

forming a third metal line within the dielectric structure and over the second metal line, wherein the third metal line further forms the landing structure, wherein the second etching process further extends the trench to the third metal line, and wherein the TSV is formed on the third metal line.

4. The method of claim 1, further comprising:

forming a guard ring structure comprising a plurality of metal gates, a plurality of metal lines, and a plurality of metal vias in the dielectric structure and collectively surrounding the landing structure and the TSV in a closed path.

5. The method of claim 1, further comprising:

depositing a dielectric liner layer over the second side of the semiconductor substrate, in the trench, and over the first metal line, wherein the second etching process extends through the dielectric liner layer directly over the first metal line.

6. The method of claim 1, wherein the first metal line is elongated in a first direction, and wherein the second metal line is elongated in a second direction, different than the first direction.

7. The method of claim 1, further comprising:

forming a shallow trench isolation (STI) layer along the first side of the semiconductor substrate, wherein the trench is partially delimited by sidewalls of the STI layer.

8. A method for forming an integrated chip, the method comprising:

forming a dielectric structure comprising a plurality of dielectric layers over a first side of a semiconductor substrate;

forming a first metal line within the dielectric structure;

forming a second metal line within the dielectric structure and over the first metal line, wherein the first metal line and the second metal line form a landing structure;

etching through the semiconductor substrate from a second side of the semiconductor substrate to uncover a portion of the first metal line;

etching the dielectric structure to uncover a portion of the second metal line; and forming a through-substrate via (TSV) over the second side of the semiconductor substrate, on the portion of the first metal line, and on the portion of the second metal line.

9. The method of claim 8, further comprising:

depositing a dielectric liner layer on sidewalls of the semiconductor substrate, an upper surface of the first metal line, and a sidewall of the first metal line before uncovering the portion of the second metal line; and etching through the dielectric liner layer before uncovering the portion of the second metal line.

10. The method of claim 8, further comprising:

forming a shallow trench isolation (STI) layer between sidewalls of the semiconductor substrate along the first side of the semiconductor substrate, wherein the first metal line is formed on the STI layer.

11. The method of claim 8, wherein the first metal line is spaced from the first side of the semiconductor substrate with the dielectric structure therebetween.

12. The method of claim 11, further comprising:

forming a third metal line within the dielectric structure and over the second metal line, the third metal line further forming the landing structure; and etching the dielectric structure to uncover a portion of the third metal line; and forming the TSV on the portion of the third metal line.

13. The method of claim 8, wherein the first metal line comprises a first metal, and wherein the second metal line comprises a second metal different than the first metal.

14. The method of claim 8, further comprising:

forming a metal bump over the second side of the semiconductor substrate and on the TSV.

15. A method for forming an integrated chip, the method comprising:

forming a first transistor and a second transistor along a first side of a semiconductor substrate and on opposite sides of a shallow trench isolation (STI) layer;

forming a dielectric structure over the first side of the semiconductor substrate;

forming a landing structure within the dielectric structure, the landing structure comprising:

a first metal line within the dielectric structure, the first metal line elongated in a first direction;

a second metal line within the dielectric structure and laterally spaced from the first metal line, the second metal line elongated in the first direction; and a third metal line within the dielectric structure and over the first metal line and the second metal line, the third metal line elongated in a second direction different than the first direction; and forming a through-substrate via (TSV) extending vertically through the semiconductor substrate, through the STI layer, and into the dielectric structure from a second side of the semiconductor substrate to a surface of the first metal line, a surface of the second metal line, and a surface of the third metal line.

16. The method of claim 15, wherein the TSV extends laterally from a sidewall of the first metal line to a sidewall of the second metal line.

17. The method of claim 15, wherein an upper surface of the TSV is between sidewalls of the semiconductor substrate.

18. The method of claim 15, wherein an upper surface of the TSV is between sidewalls of the dielectric structure.

19. The method of claim 15, further comprising:
forming a plurality of metal lines and a plurality of metal vias collectively surrounding the landing structure and the TSV in a closed path to form a guard ring structure around the landing structure and the TSV.

20. The method of claim 15, further comprising:
forming a first metal via within the dielectric structure and extending from the first metal line to the third metal line; and
forming a second metal via within the dielectric structure and extending from the second metal line to the third metal line.

* * * * *